US00RE47832E

(19) United States
(12) Reissued Patent
Ruotsalainen et al.

(10) Patent Number: US RE47,832 E
(45) Date of Reissued Patent: Jan. 28, 2020

(54) CLOCK GENERATION CIRCUIT WITH FAST-STARTUP STANDBY MODE

(71) Applicant: Telefonaktiebolaget LM Ericsson (publ), Stockholm (SE)

(72) Inventors: Tarmo Ruotsalainen, Oulu (FI); Joni Tuomas Jäntti, Oulu (FI)

(73) Assignee: TELEFONAKTIEBOLAGET LM ERISSON (PUBL), Stockholm (SE)

(21) Appl. No.: 16/176,535

(22) Filed: Oct. 31, 2018

Related U.S. Patent Documents

Reissue of:
(64) Patent No.: 9,484,893
Issued: Nov. 1, 2016
Appl. No.: 14/690,753
Filed: Apr. 20, 2015

(51) Int. Cl.
*H03K 3/00* (2006.01)
*H03K 3/012* (2006.01)
*H03K 19/00* (2006.01)

(52) U.S. Cl.
CPC ..... *H03K 3/012* (2013.01); *H03K 19/0016* (2013.01)

(58) Field of Classification Search
CPC ..... H03K 3/00; H03K 3/012; H03K 19/00; H03K 19/0016
USPC ..... 714/738, 798; 327/124, 127, 298
See application file for complete search history.

(56) References Cited

U.S. PATENT DOCUMENTS 4,250,464 A 2/1981 Schade, Jr.
5,920,236 A 7/1999 Ishizaki
7,005,933 B1 2/2006 Shutt
7,636,019 B1 12/2009 Lombaard et al.
8,448,001 B1 5/2013 Zhu et al.
9,391,509 B2 * 7/2016 Wu ..... H02M 3/07
9,391,595 B2 * 7/2016 Higuchi ..... H03K 3/03
9,722,490 B2 8/2017 Archibald
2006/0017518 A1 1/2006 Wilcox
(Continued)

FOREIGN PATENT DOCUMENTS

JP 2013137689 A 7/2013
KR 2005074755 A 7/2005
WO 0033594 A1 6/2000

OTHER PUBLICATIONS

Tokairin et al., A 280nW, 100kHz, 1-Cycle Start-up Time, On-chip CMOS Relaxation Oscillator Employing a Feedforward Period Control Scheme, 2012 Symposium on VLSI Circuits Digest of Technical Papers, pp. 16-17.
(Continued)

*Primary Examiner* — My Trang Ton
(74) *Attorney, Agent, or Firm* — Coats & Bennett, PLLC

(57) ABSTRACT

A clock generation circuit operates in a STANDBY mode as well as conventional OFF and ON modes. In STANDBY mode, a small pre-bias current is applied to amplifiers in the clock generation circuit, which bias voltages on internal nodes to very near their operating voltage values. This reduces transient perturbations on signals as the clock generation circuit is returned to ON mode. The smaller transients settle faster, and allow the clock generation circuit to achieve very fast startup times from STANDBY to ON. The very fast startup times allow the clock generation circuit to be placed in STANDBY mode more often, such as when a system must monitor and rapidly respond to activity on an external bus or interface (such as an RF modem).

29 Claims, 20 Drawing Sheets

(56) References Cited

U.S. PATENT DOCUMENTS

| | | | | |
|---|---|---|---|---|
| 2009/0085685 | A1 | 4/2009 | Guo et al. | |
| 2009/0256599 | A1* | 10/2009 | Shinomiya et al. | H03K 17/223 327/143 |
| 2013/0057352 | A1 | 3/2013 | Liang et al. | |

OTHER PUBLICATIONS

Intersil Corporation, Improving Start-up time at 32kHz for the HA7210 Low Power Crystal Oscillator, Application Note, Dec. 2000, AN9334.2, Melbourne, Florida, USA, pp. 1-3.

De Heyn et al. A fast start-up 3GHz-10GHz digitally controlled oscillator for UWB impulse radio in 90nm CMOS. Solid State Circuits Conference, 2007. ESSCIRC 2007. 33rd European, Sep. 11-13, 2007, pp. 484-487.

Nordic Semiconductor ASA, Preliminary Product Specification Rev. 1.2, Single chip 2.4 GHz Transceiver, nRF24L01, Mar. 2006, Tiller, Norway, pp. 1-39.

* cited by examiner

AMENDED

AMENDED

AMENDED

AMENDED

AMENDED

AMENDED

AMENDED

AMENDED

AMENDED

AMENDED

AMENDED

AMENDED

AMENDED

AMENDED

AMENDED

AMENDED

AMENDED

AMENDED

AMENDED

NEW

CLOCK GENERATION CIRCUIT WITH FAST-STARTUP STANDBY MODE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This present application is a reissue application of U.S. Ser. No. 14/690,753, filed Apr. 20, 2015, which issued on Nov. 1, 2016 as U.S. Pat. No. 9,484,893.*

FIELD OF INVENTION

The present invention relates generally to clock generation circuits, and in particular to a clock generation circuit having a standby mode featuring low power consumption and fast start-up time.

BACKGROUND

Portable electronic devices are ubiquitous accoutrements in modern life. Cellular telephones, smartphones, satellite navigation receivers, e-book readers and tablet computers, wearable computers (e.g., glasses, wrist computing), cameras, and music players are just a few examples of the many types of portable electronic devices in widespread use. Portable electronic devices are powered by batteries—either replaceable batteries such as alkaline cells, or rechargeable batteries such as NiCd, NiMH, LiOn, or the like. In either case, the useful life of portable electronic devices is limited by available battery power, which decreases in proportion to the length of use of the device, and the level of power consumption during that use.

Trends in portable electronic device design exacerbate the problem of limited available power. First, device form factors tend to shrink, due to increasing integration of electronics and miniaturization of component parts, such as disk drives. This forces the size of the battery to shrink as well, which generally reduces the available energy storage capacity. Second, electronic devices are increasingly sophisticated, offering new applications, more sophisticated user interfaces, enhancements such as encryption, and the like. The additional software implementing these features requires increased computational power to execute, which translates to larger, or additional, processors and more memory. Finally, successive generations of portable electronic device often add additional features such as various modes of wireless connectivity, which may require the integration of additional chip sets and other electronics. An increase in the demand for power by more processors and circuits, coupled with ever-shrinking battery size and capacity, has made power management a critical area of optimization for portable electronic device designers.

Several approaches to power management are known in the art. One such approach is to identify circuits (or sub-circuits) that are not used for extended periods, and put them into a low-activity state, also referred to as a "sleep" mode, even if other circuits in the device are fully active. As one example, the illuminated display screen of many devices will shut off after a (selectable) duration of no user interactivity. One way to shut down digital circuits is to isolate clocks signals from these circuits. Since storage elements within the digital circuits only change state in response to clock signal edges or levels, power-consuming electrical activity within the circuits effectively ceases.

A more sophisticated approach to the "sleep" technique is to match the frequency of a clock signal to the level of activity of a digital circuit. For example, a processor engaged in heavy computation may be clocked at a high frequency, to extract maximum performance. However, when the processor is performing merely background tasks, the frequency of its clock signal may be reduced without a user-noticeable degradation of performance, which concomitantly reduces the power consumed.

Another approach to power management is to vary the power supplied to various circuits (or sub-circuits) according to the instantaneous load of the circuit. In this manner, circuits that are engaged in computation or other activity are provided sufficient power to operate, and circuits experiencing a lighter load are provided with a lower level of current.

All of these power management techniques are problematic when applied to a wireless modem *58, as depicted in FIG. 22*, which may include a digital broadband integrated circuit (IC) *60*, radio frequency IC *62*, and power amplifier *64*. When a user is actively using the data connection and expecting high download speed and short latency, the modem *58* is configured with highest performance settings, such as high speed clocks, full power, and all circuits enabled. When the data connection requirements are relaxed, there is an opportunity to save power by lowering the wireless modem *58* performance, such as by lowering clock frequencies, gating clocks to some circuits, lowering supply voltages, and shutting down circuits that are not used. Such wireless modem *58* throttling is limited by the fact that the user may resume data connection usage at any time, and the wireless modem *58* must return from a power-saving mode to full performance, without user-perceptible delay. This means that the wireless modem *58* has a few tens of milliseconds to resume from a power-saving mode to a high performance mode.

When the wireless modem enters a limited performance or power-saving mode, voltage regulators may be configured to a mode where output current capability is limited. Another power-saving measure is to limit clock signal distribution to switching mode analog blocks (e.g., Switched Mode Power Supply) by digital control such as clock gating, or even disabling the clock generation circuit completely. Disabling the clock generation circuit achieves the best power savings, but it can be done only when none of the wireless modem circuits require a clock signal. Another constraint is that the clock generation circuit must have a start-up time fast enough to satisfy the full power transition time requirements of all blocks receiving the clock signal(s).

New generations of wireless modem design simultaneously require higher frequency and reduced power consumption. For example, a 6.5 MHz control bus is targeted, in future designs, to operate at 26 MHz. One approach to reaching these challenging design goals is to enter restricted-clock, or "sleep" mode more often. However, this requires a very fast start-up time from the dormant state, such as 1.5 u-sec, compared to current designs of 10 u-sec.

A large challenge to designing a clock generation circuit with a fast start-up time, but which consumes little power during operation, is that RC factors are large and bias currents are small. As intermediate nodes begin to charge from ground (or supply voltage), they not only charge slowly but also it takes time for transient perturbations in the node voltages to settle. Settling of the node voltages at the proper operating values is essential to achieve an accurate clock signal.

Known approaches to decreasing the clock generation circuit start-up time include boosting bias currents, disconnecting capacitors, and transferring target voltages directly to intermediate and output nodes. All of these approaches suffer from the deficiency that once intermediate circuit nodes are charged, it still takes time to settle the node voltage sufficiently to achieve frequency stability. Accordingly, the known approaches are insufficient to reduce clock generation circuit start-up time by the necessary amount.

Korean Patent Publication No. KR-20050074755 by K. Han, titled "Low power relaxation oscillator circuit," describes a boost circuit that injects current into both nodes n1 and n2 of the capacitor C of a relaxation oscillator.

The paper by T. Tokairin, et al., titled, "A 280 nW, 100 kHz, 1-Cycle Start-up Time, On-chip CMOS Relaxation Oscillator Employing a Feedforward Period Control Scheme," published in the 2012 Symposium on VLSI Circuits Digest of Technical Papers, p. 16, describes a scheme to shift the oscillator switching delay to prior to a comparator reaching a reference voltage as the capacitor charges. This is accomplished by doubling the charging current at the beginning of every half cycle of oscillation, which the authors refer to as "boost charging."

U.S. Pat. No. 7,005,933 to J. Shutt describes a dual mode relaxation oscillator that generates clock signals in both normal and low-power mode, with the clock in low-power mode being less accurate.

U.S. Pat. No. 4,250,464 to O. Schade describes a multi-mode relaxation oscillator which generates a lower frequency clock signal in low-power mode than in normal operating mode.

The Application note AN9334.2 published by Intersil Corporation, titled "Improving Start-up Time at 32 KHz for the HA7210 Low Power Crystal Oscillator," December 2000, describes a crystal oscillator having an enable pin operative to turn off an output buffer in stand-by mode to save power. The internal oscillator continues to run in stand-by mode. Power savings are limited to 50%.

None of these prior art solutions can achieve a high frequency clock generation circuit having a low-power mode with approximately 90% power consumption reduction, yet with very short start-up time to return to full operating mode of approximately 1.5 u-sec.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, a clock generation circuit operates in a STANDBY mode as well as conventional OFF and ON modes. In STANDBY mode, a small bias current is applied to amplifiers in the clock generation circuit, which bias voltages on internal nodes to very near their operating voltage values (i.e., in ON mode). This reduces transient perturbations on signals as the clock generation circuit is returned to ON mode. The smaller transients settle faster, and allow the clock generation circuit to achieve very fast startup times from STANDBY to ON—for example, in the range of 15% of startup time from OFF to ON (i.e., 1.5 usec as compared to 10 usec). The very fast startup times allow the clock generation circuit to be placed in STANDBY mode more often, such as when a system must monitor and rapidly respond to activity on an external bus or interface (such as an RF modem). The small bias current applied in STANDBY mode may be in the range of 10% of the bias current applied to the clock generation circuit in ON mode.

One embodiment relates to a method of operating a clock generation circuit on an integrated circuit, the clock generation circuit including an oscillator circuit. Clock request indicators from one or more circuits are monitored. If at least one circuit requests a clock signal, the clock generation circuit is operated in a first, full power mode in which the clock generation circuit outputs at least one clock signal. If no circuit requests a clock signal, it is determined whether a second, sleep mode is allowed, in which the oscillator circuit is disabled and the clock generation circuit outputs no clock signal. If the second, sleep mode is allowed, the clock generation circuit is operated in the second, sleep mode. If the second, sleep mode is not allowed, the clock generation circuit is operated in a third, standby mode in which one or more circuit nodes in the clock generation circuit are biased near their operating voltages but the oscillator circuit does not oscillate and the clock generation circuit outputs no clock signal.

Another embodiment relates to a clock generation circuit. The clock generation circuit includes an oscillator circuit operative to selectively generate a periodic signal. The clock generation circuit also includes an output circuit receiving a periodic signal from the oscillator circuit and operative to selectively output at least one clock signal. The clock generation circuit further includes a bias circuit operative to control the clock generation circuit to operate in one of three modes, selected from the group consisting of a first, full power mode in which the output circuit outputs at least one clock signal; a second, sleep mode in which the oscillator circuit is disabled and the output circuit outputs no clock signal; and a third, standby mode in which nodes within the oscillator circuit and output circuit are biased near their operating voltages but the oscillator circuit does not oscillate and the output circuit outputs no clock signal.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Figure 1:
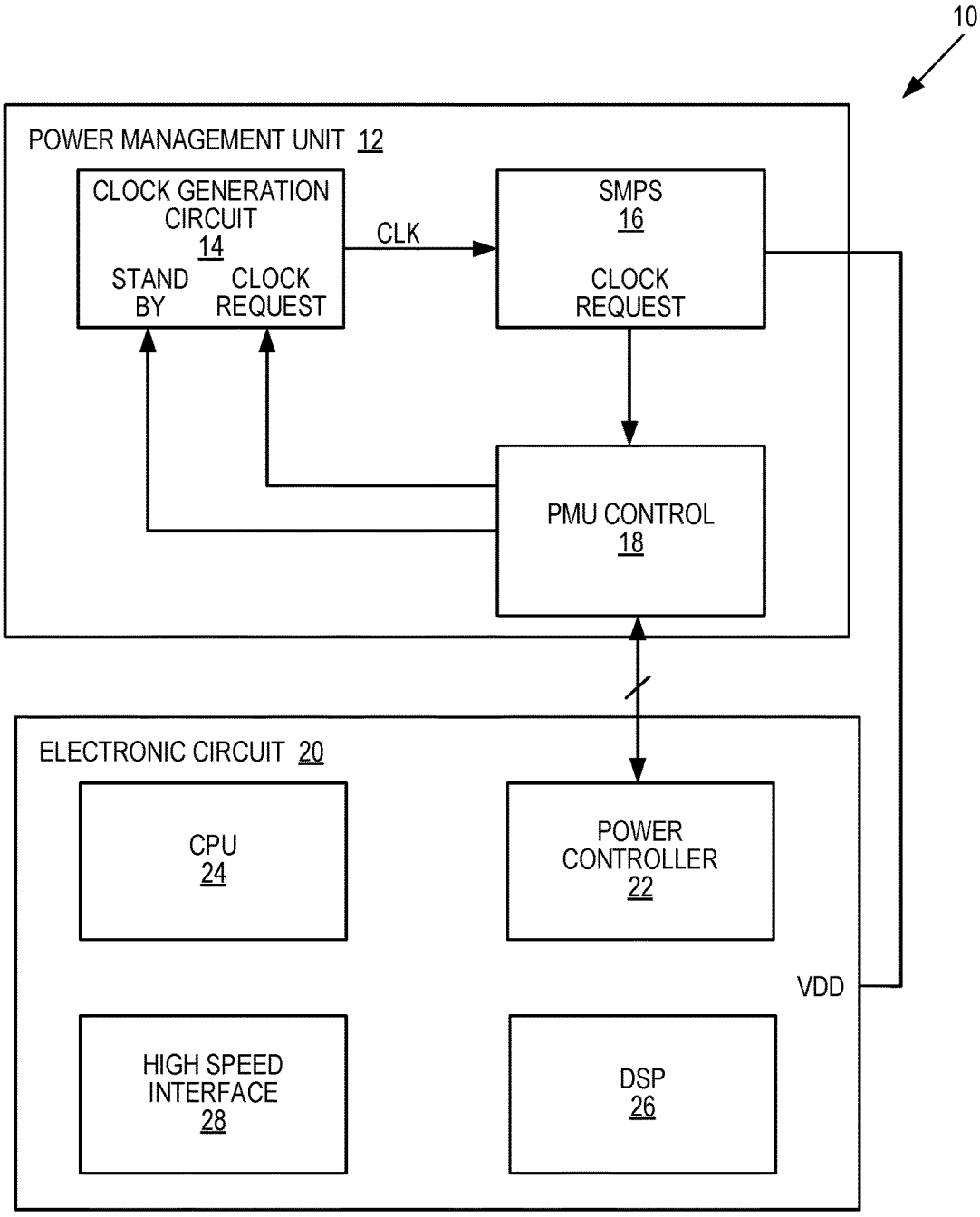
FIG. 1 is a functional block diagram of some circuits in a portable electronic device.

FIG. 1 depicts portions of a representative system 10 in a portable electronic device. The system 10 includes a Power Management Unit (PMU) 12 and an electronic circuit 20, such as the baseband processing system of a wireless communication terminal. A digital baseband circuit is the heart of a wireless modem in a communication terminal, receiving baseband data from an RF transceiver (not shown) and decoding user data from it, as well as encoding user data and sending it to the RF transceiver to be transmitted over the air.

The PMU 12 includes a clock generation circuit 14, a Switched Mode Power Supply 16, and a control circuit 18. The clock generation circuit 14 generates one or more clocking signals to drive the power transfer switches in the SMPS 16, which regulates and transfers power (e.g., from a battery) to the digital or analog electronic circuit 20, and other circuits (not shown). Thus, suspending the operation of the clock generation circuit 14 will shut down power supplied to the electronic circuit 20.

The electronic circuit 20 includes a power controller circuit 22, and may include various digital or analog circuits, such as a processor 24 and/or Digital Signal Processor (DSP) 26, and a high speed interface 28, such as to memory, an external bus, a wireless transceiver, or the like. The power controller circuit 22 may communicate with the PMU control circuit 18 via a serial interface such as I2C or SPMI. The PMU 12 thus receives clock requests and commands from the power control circuit 22, and controls circuits on the PMU 12 in response, such as adjusting bias voltages and currents, enabling/disabling clock drivers, adjusting the duty cycle of the SMPS 16 switching, and the like. Only the control signals relevant to discussion of embodiments of the present invention are shown; those of skill in the art will recognize that the circuits depicted may interact via numerous other control, clock, power, and similar signals. Accordingly, those of skill in the art will readily recognize that the block diagram of FIG. 1 is representative only, and is no way limiting regarding the application of embodiments of the present invention.

To preserve battery power, one or more of the circuits 24, 26, 28 may be placed into "sleep" mode, by reducing or eliminating the power supplied to the circuit 24, 26, 28, or by suspending the clock signals supplied to a digital circuit. One straightforward way to suspend power from the SMPS 16 is to halt the clock signal from the clock generation circuit 14 that drives the SMPS 15 energy transfer switches. The clock signal may be suspended by gating off the output of the clock generation circuit 14, while leaving its internal oscillator running. This allows for faster start-up time, but is less efficient as the clock generation circuit 14 continues to consume power. For greater power savings, when a long startup time can be tolerated, the entire clock generation circuit 14, including its oscillator, may be shut down. Accordingly, known clock generation circuits have two operational states: ON and OFF.

According to one or more embodiments described herein, a clock generation circuit 14 has three operational states or modes: ON, OFF, and STANDBY. During STANDBY mode, certain intermediate circuit nodes internal to the clock generation circuit 14 are charged to a target voltage with a small bias current, referred to herein as a pre-bias. The pre-bias current can be scaled to a minimal value, e.g., in the range of 10% of the clock generation circuit ON mode bias current. Simulations of embodiments reveal an improvement in startup time from STANDBY to ON modes of 1.5 usec, as opposed to the OFF to ON startup time of 10 usec. Although the clock generation circuit 14 consumes some current in STANDBY mode, the faster startup time allows the system 10 to disable the clock generation circuit 14 more often, as compared to conventional clock generation circuits, with their longer OFF to ON startup time.

Figure 2:
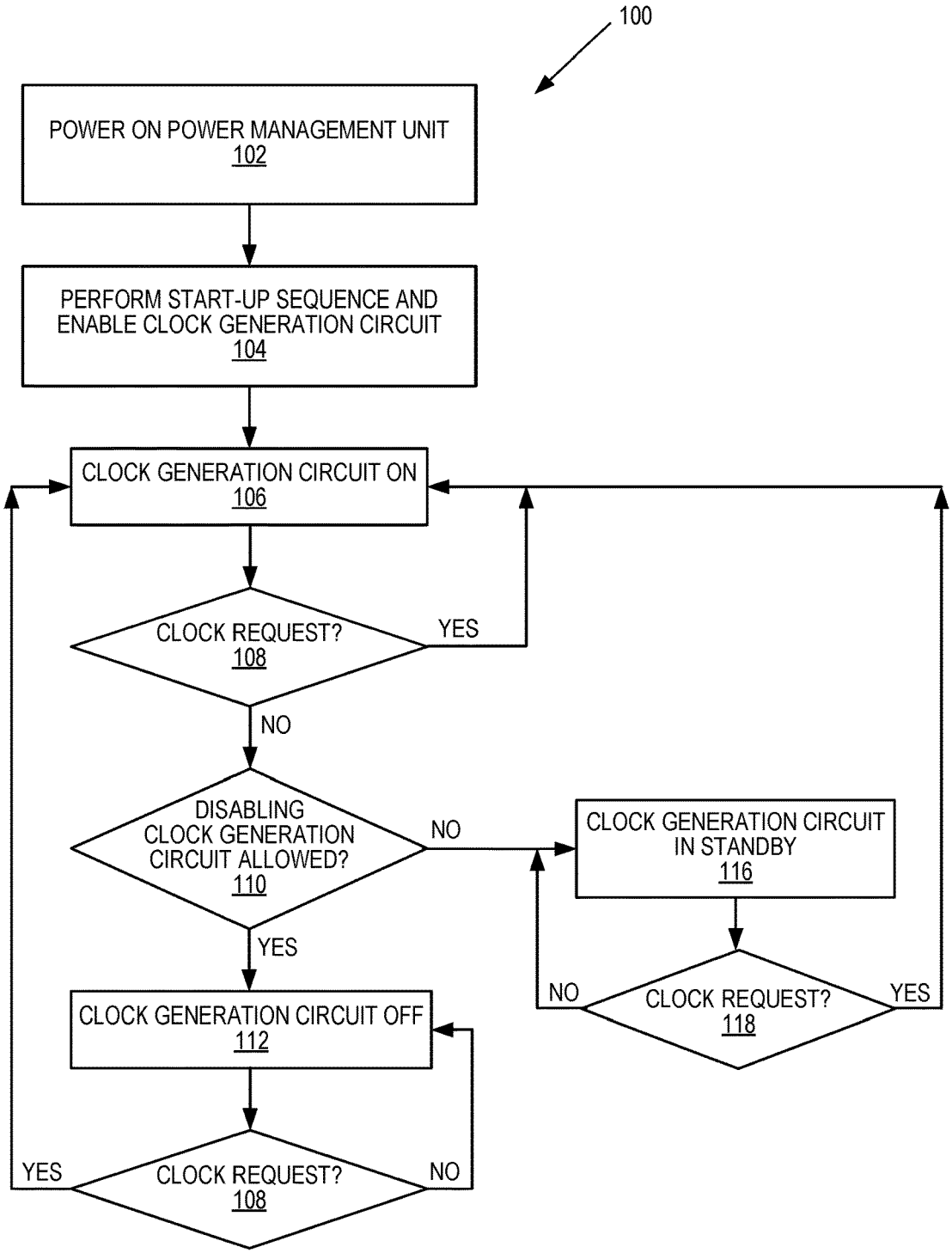
FIG. 2 is a flow diagram of a method of providing system power.

FIG. 2 depicts an overall method 100 of delivering power to an electronic circuit 20, such as a digital baseband system, in a portable electronic device. Initially, the PMU 12 is powered on (block 102). The PMU 12 performs a start-up sequence, which includes powering ON a clock generation circuit 14, and conditioning the clock generation circuit 14 output to generate one or more clock signals (block 104). The clock signals may, for example, provide a switching signal for the SMPS 16 that deliver power to the other electronics 20 in the system 10. After a relatively long startup duration (e.g., 10 usec), the clock generation circuit 14 is in an ON state (block 106).

As long as at least one circuit 16, 24, 26, 28 or module in the system 10 requests a clock signal (block 108), the clock generation circuit 14 remains ON (block 106). In the event that all relevant electronic circuits 16, 24, 26, 28 are placed in a "sleep" mode to preserve power (block 108), the method 100 checks whether the clock generation circuit 14 may be fully disabled (block 110). This may comprise, for example, checking the state of one or more status bits in a status register or other predefined memory location. In use cases where a fast startup time is not critical, and maximum power savings are desired, the PMU 12 turns the clock generation circuit 14 OFF (block 112). The clock generation circuit 14 remains OFF until a circuit 16, 24, 26, 28 requests a clock signal (block 114), when the clock generation circuit 14 is turned ON (block [105] *106*) and power and clocks are supplied. This transition (block 112 to 106) incurs a significant delay.

When it is again decided to place the system 10 in sleep mode (block 108) but a fast startup time is required (e.g., to respond to activity on an external bus, to process an incoming wireless signal, or the like), the status information (block 110) may indicate that the PMU 12 may place the clock generation circuit 14 in STANDBY mode (block 116). In STANDBY mode, the clock generation circuit 14 does not generate an output; however, a voltage is maintained on internal nodes by a small pre-bias current. Because of the pre-bias current, when a circuit 24, 26, 28 again requests a clock signal (block 118), the clock generation circuit 14 may exit STANDBY and be fully ON (block 106) and operational in a very short startup time (e.g., 1.5 usec). The fast startup time enables greater use of STANDBY mode, reducing overall power consumption.

Figure 3:
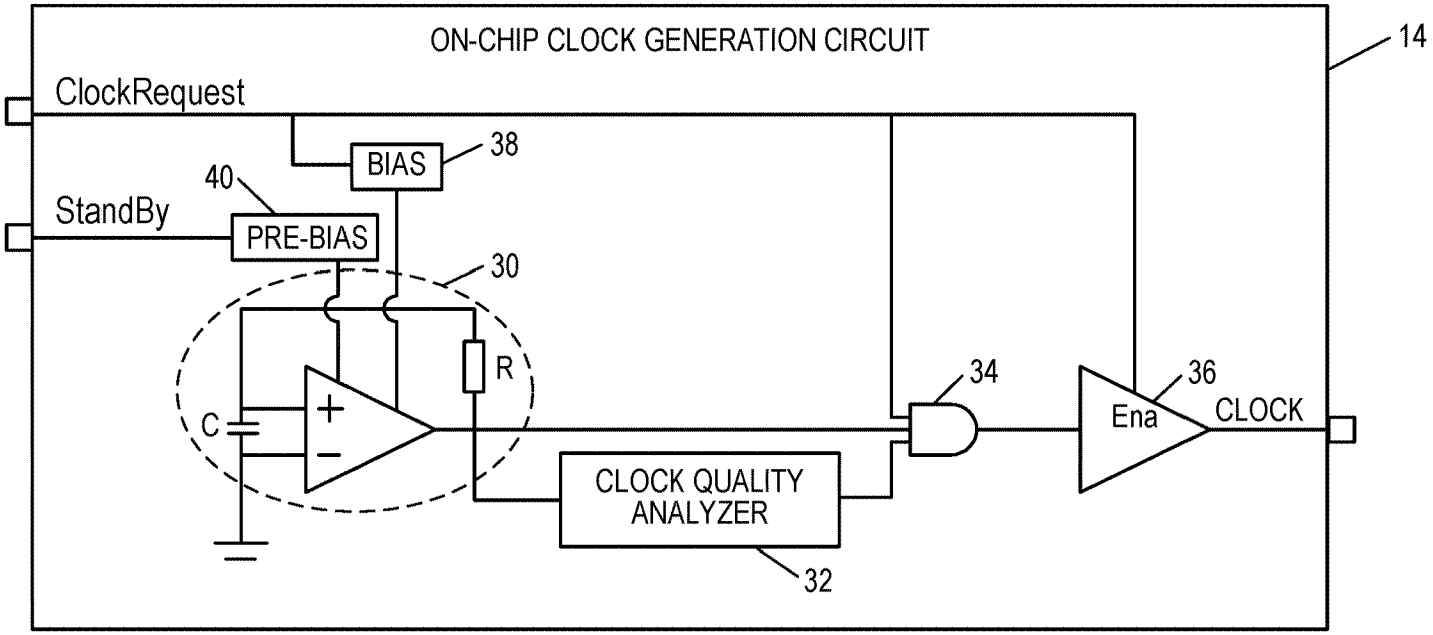
FIG. 3 is a functional schematic diagram of one embodiment of a clock generation circuit.

FIG. 3 depicts one embodiment of a clock generation circuit 14. The clock generation circuit 14 includes an RC oscillator 30, clock quality analyzer 32, AND gate function 34, and output driver 36. As well known in the art, the op amp in the RC oscillator 30 will generate a periodic output signal, the frequency of which depends on the values of the capacitor C and resistor R, when a bias driver 38 powers up the oscillator 30 op amp, and provides a relatively large bias current. A clock quality analyzer circuit 32 monitors the oscillator 30 output, and will only output a "1" toward the AND function 34 when the clock signal meets predetermined quality specifications regarding voltage, frequency, jitter, ripple, duty cycle, and the like. The AND gate function 34 allows the RC oscillator 30 output to pass to the output buffer 36 only if the ClockRequest input is asserted, and the clock quality analyzer circuit 32 determines that the clock signal is within specification. In conventional clock generation circuits, the clock quality analyzer circuit 32 may suspend the clock signal for 10 usec or more, in transitioning from OFF to ON.

According to embodiments of the present invention, a StandBy input signal triggers a pre-bias driver 40 to provide a lower, pre-bias current to the amplifier in the RC oscillator 30 when the oscillator 14 is in STANDBY mode. The pre-bias current keeps the amplifier charged, but is insufficient to enable oscillation. When the ClockRequest signal is asserted, full bias is established and the RC oscillator 30 starts up, quickly settling to the proper output point, generating a high quality clock signal at the correct frequency. The clock quality analyzer circuit 32 verifies this, and rapidly enables the AND gate function 34 to pass the clock signal to the output buffer 36.

Figure 4:
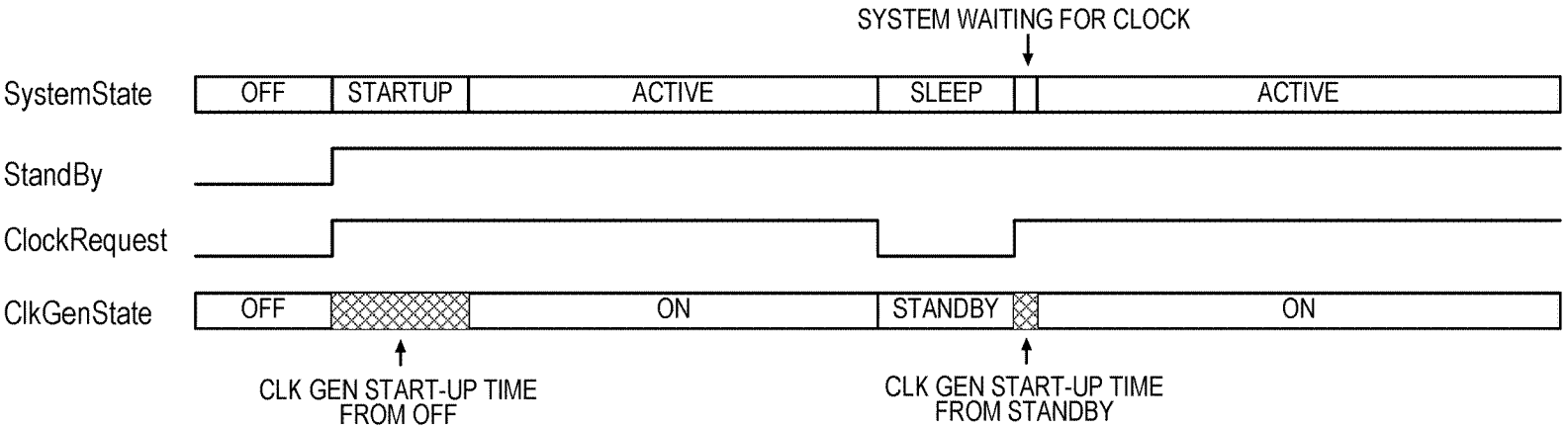
FIG. 4 is a timing diagram showing system operational states and control signals.

FIG. 4 is a timing diagram depicting the operational state of the system 10 and the clock generation circuit 14, as well as control signals StandBy and ClockRequest. Initially, the system 10 (including the clock generation circuit 14) is OFF. Upon power-up, the system 10 is in a STARTUP state during which various circuits 12, 20 power up and initialize. During this time, the clock generation circuit 14 transitions from OFF to ON states, as indicated by the relatively long hashed startup time. Generally, the clock generation circuit 14 startup time is not the critical system startup parameter, as other circuits (e.g., processors 24, 26) have much longer initialization/boot-up sequences.

Once all circuits initialize, the clock generation circuit 14 provides at least one clock signal to the SMPS 16, which provides power to circuits 24, 26, 28. The system 10 is in ACTIVE state. When operational conditions permit, for power conservation purposes the system 10 goes into SLEEP mode, and the clock generation circuit 14 is placed in STANDBY. This occurs because ClockRequest is deasserted, indicating no circuit 16, 24, 26, 28 requires clock signals. However, the StandBy signal remains asserted. This causes a pre-bias current to be applied to the RC oscillator circuit 30 within the clock generation circuit 14, almost fully charging the amplifier and maintaining the output node at near its operational voltage. When the system 10 exits SLEEP mode by again asserting ClockRequest, only a very short startup time is required to transition the clock generation circuit 14 from STANDBY to ON. This translates to a corresponding brief duration in which the system 10 transitions from SLEEP to ACTIVE mode.

Figure 5:
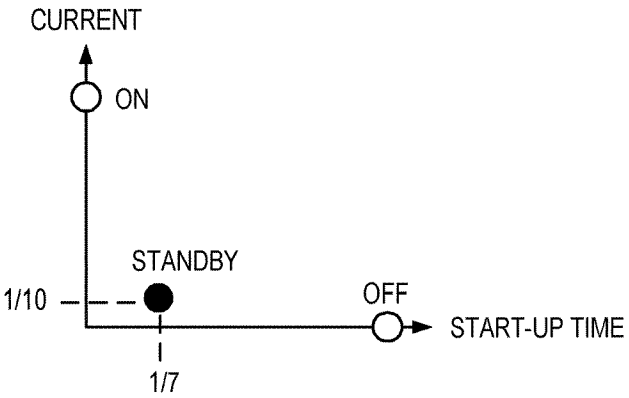
FIG. 5 is a qualitative graph of current consumption vs. startup time for a clock generation circuit.

FIG. 5 is a qualitative graph depicting the relationship between current consumption and startup time for each of the three operating modes of the clock generation circuit 14. When the clock generation circuit 14 is ON, there is no problem with startup time; however, the current consumption is at a maximum. When the clock generation circuit 14 is OFF there is zero current consumption, but the startup time is long. The STANDBY mode provides a compromise. The power consumption is only 1/10 that during the fully ON state, and while the startup time is not zero, it is only 1/7 the time required to transition out of the OFF state. For use cases where tight startup time requirements preclude turning the clock generation circuit 14 fully OFF, the STANDBY mode provides an additional way to save 90% of the power, while still satisfying startup time requirements.

Figure 6:
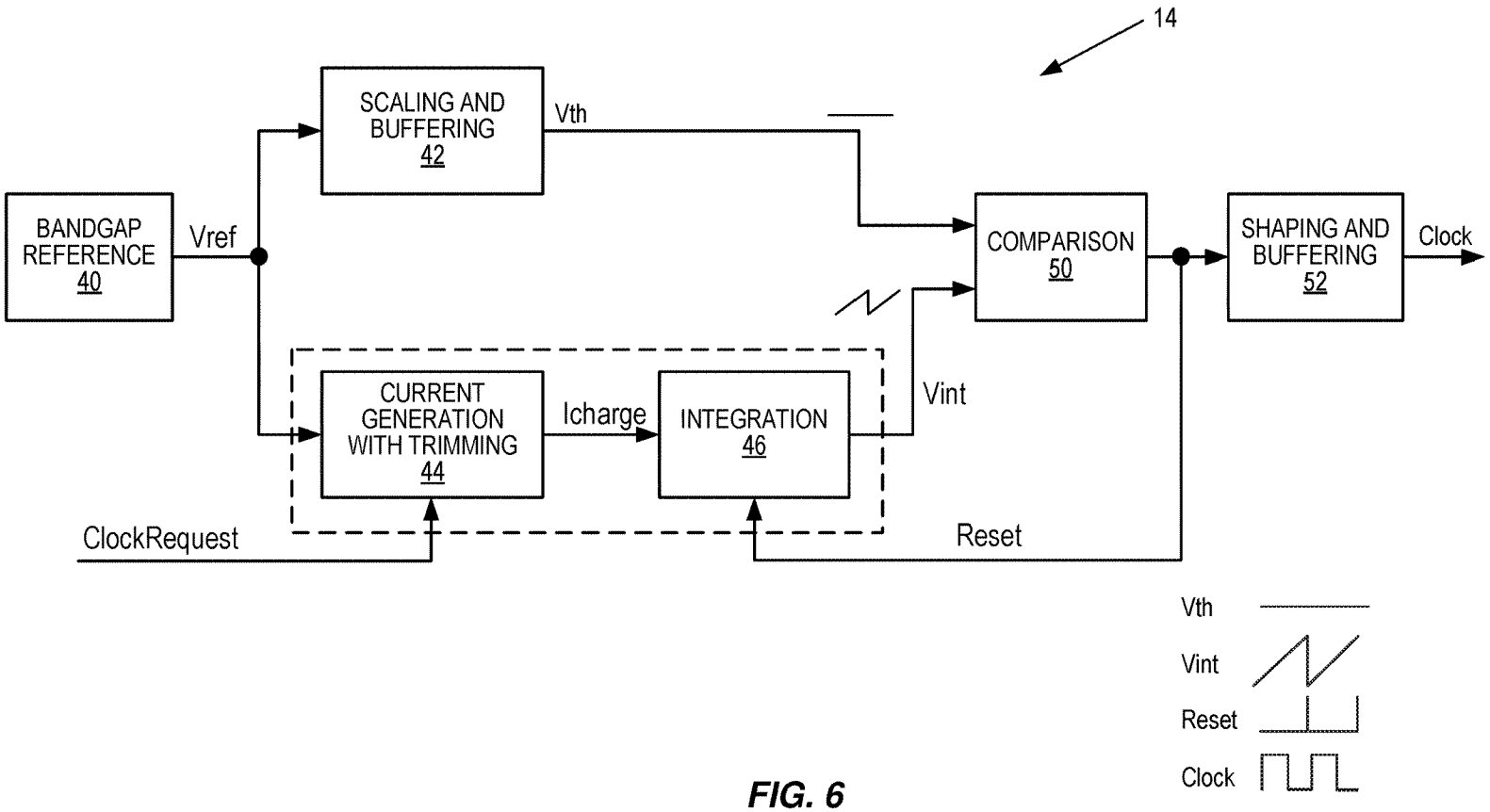
FIG. 6 (prior art)
FIG. 6 is a functional block diagram of a relaxation oscillator.

The clock generation circuit 14 depicted in FIG. 3 is based on an RC oscillator 30. A more complex, and more commonly deployed, form of clock generation circuit 14 employs a relaxation oscillator, depicted in block diagram form in FIG. 6. A relaxation oscillator operates by repeatedly charging and discharging an integration capacitor via a feedback loop.

A bandgap reference circuit 40 generates a reference voltage Vref, and provides it to both a scaling/buffering circuit 42 and the current generation circuit 44. The scaling and buffering circuit 42 scales and buffers the reference voltage Vref, outputting a steady threshold voltage Vth. The current generation with trimming circuit 44 generates a charging current Icharge, which charges an integration capacitor in an integration circuit 46. As indicated by the dashed-line box, the current generation circuit 44 and integration circuit 46 are tightly coupled.

The integration circuit 46 outputs a saw-tooth integrated voltage Vint, which increases as the integration capacitor charges and returns to zero when the capacitor discharges. A comparison circuit 50 compares the integrated voltage Vint to the threshold voltage Vth, and generates a reset impulse when they are equal. The reset signal is fed back to the integration circuit 46, as a trigger to discharge the integration capacitor. The integration capacitor then begins charging again to generate the next cycle. A shaping and buffering circuit 52 conditions the saw-tooth wave of the integrated voltage Vint, outputting a square clock signal Clock. The frequency of the Clock signal is determined by the threshold voltage Vth and the magnitude of the current Icharge, which directly controls the charging time of the integration capacitor.

Figure 7:
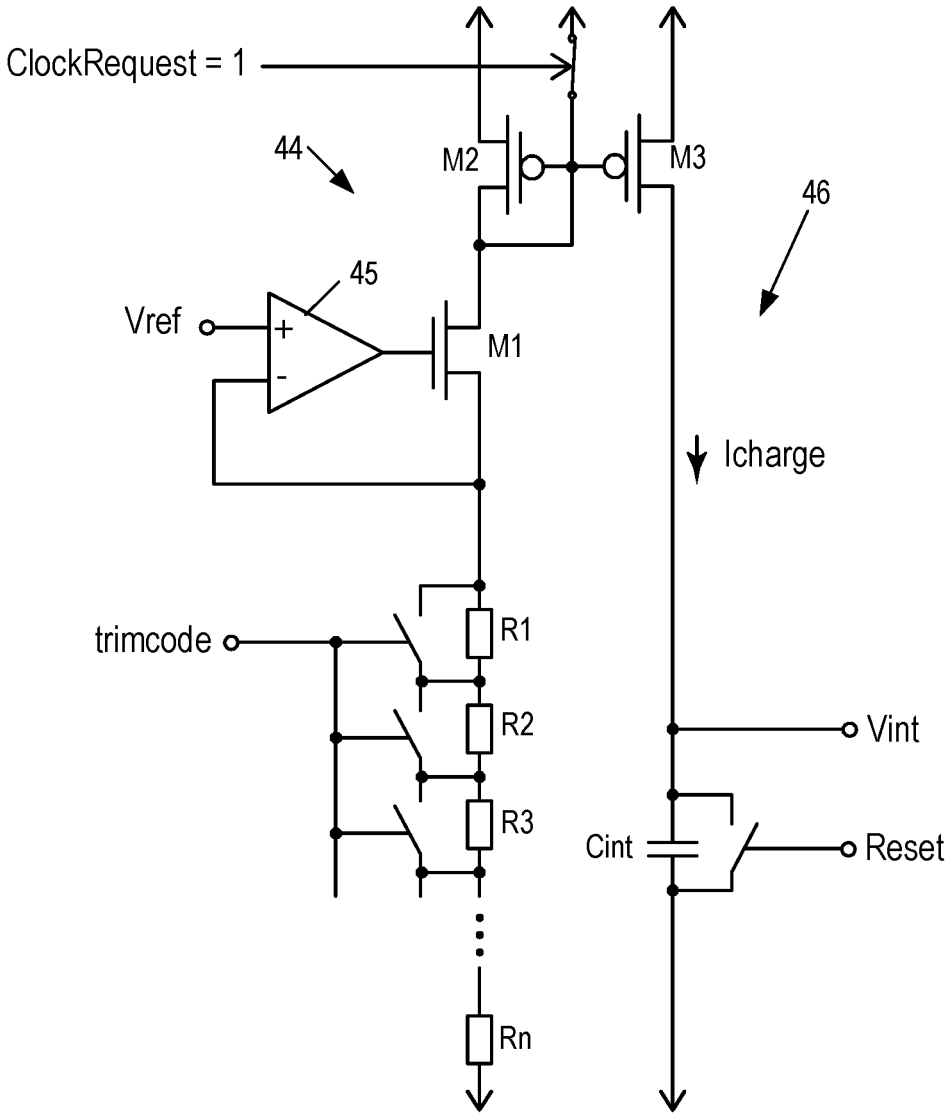
FIG. 7 (prior art)
FIG. 7 is a functional schematic diagram of the current generation and integration circuits of the oscillator of FIG. 6.

FIG. 7 depicts a conventional implementation of the current generation circuit 44 and integration circuit 46. A trim code applied to the chain of resistors sets the resistance in the current generating path 44 (i.e., through transistor M1, the gate of which is controlled by the amplifier 45), thus controlling the current through this path. A current mirror comprising matched transistors M2 and M3 copies this current to a proportional charging current Icharge in the integration path 46, where it charges the integration capacitor Cint. The integration circuit 46 outputs the integrated voltage Vint as the voltage across the capacitor Cint. The reset signal received in feedback from the comparison circuit 50 discharges the capacitor to begin the next charging iteration. When the ClockRequest=0 to place the clock generation circuit 14 in OFF state, the gates of the current mirror are pulled high, shutting off both transistors and halting the charging current flow. When these circuits 44, 46 are again turned ON, transients at the output of the amplifier 45 must settle before a stable charging current Icharge is reestablished, which is necessary for frequency-stable clock generation.

Figure 8:
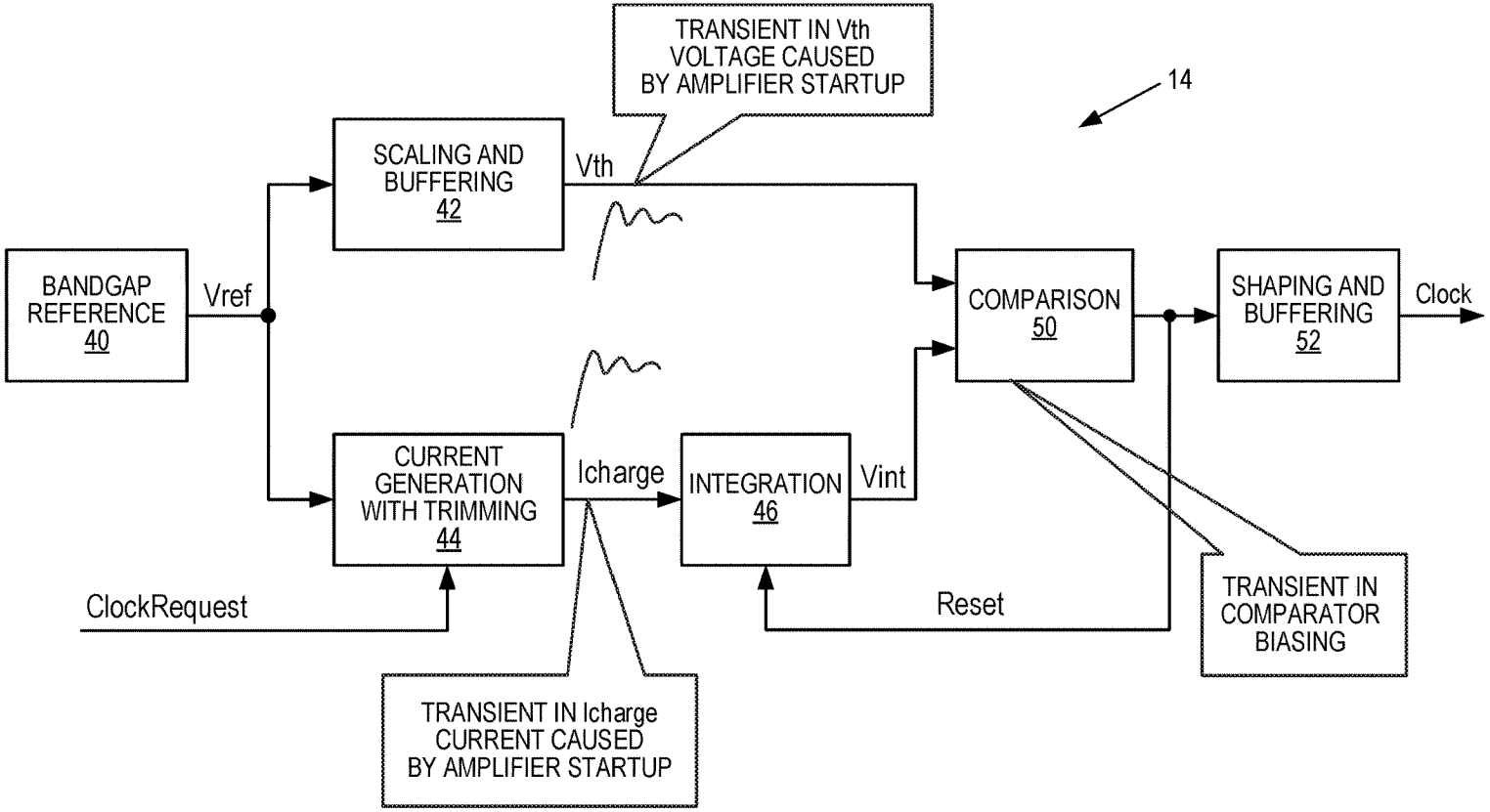
FIG. 8 (prior art)
FIG. 8 is a functional block diagram of a relaxation oscillator, identifying the points of transient instability.

However, the current generation circuit 44 and integration circuit 46 are not the only sources of startup transients that cause a lengthy startup time in transitioning the clock generation circuit 14 from OFF to ON. FIG. 8 depicts transients in the threshold voltage Vth caused by the amplifier startup. Additionally, the charging current Icharge experiences transients. Furthermore, transients appear in the biasing of the comparator in the comparison circuit 50. All of these transients must settle, and the relevant nodes reach a steady-state voltage, before a clock signal can be output.

Figure 9:
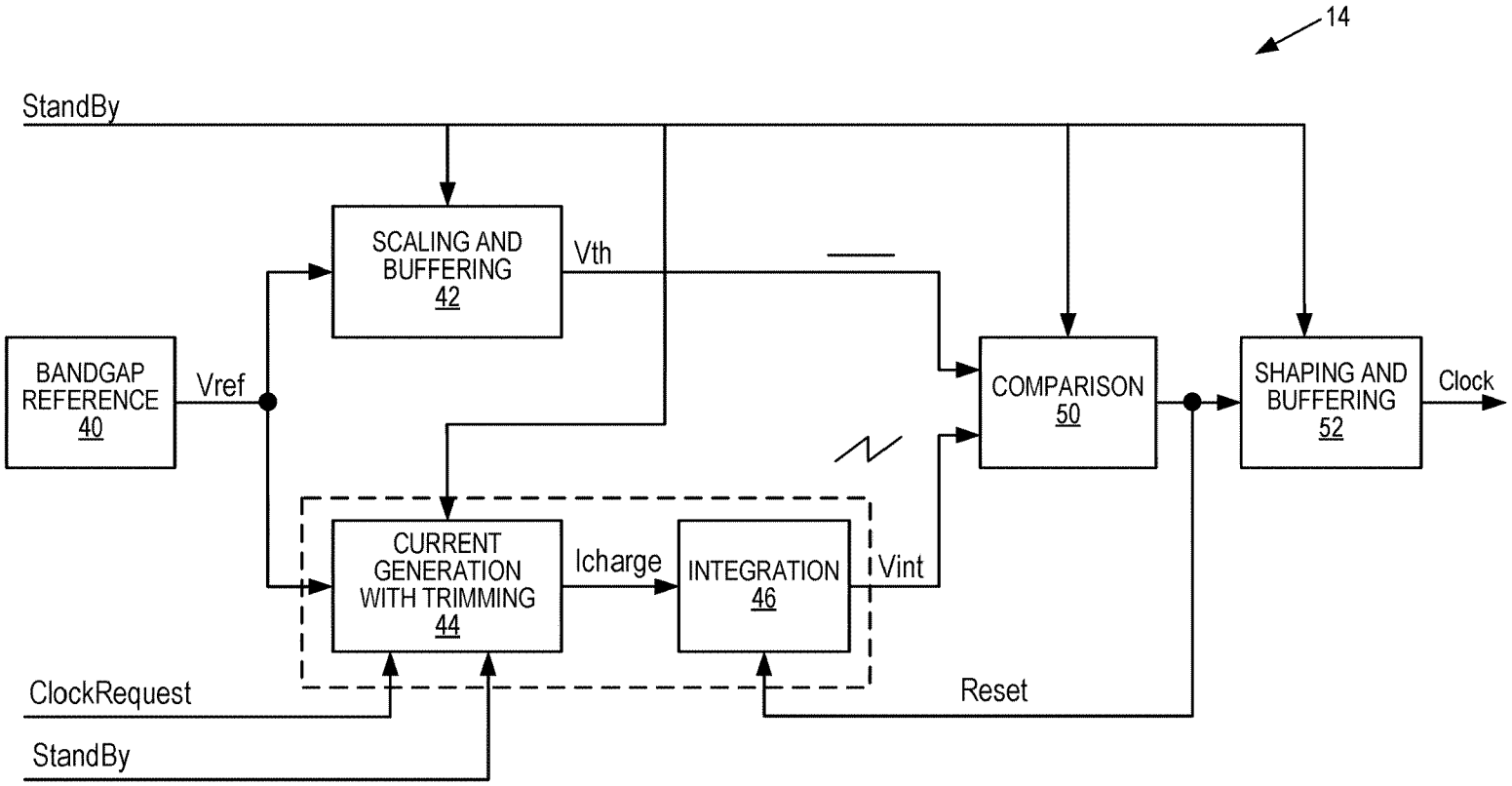
FIG. 9 is a functional block diagram of a relaxation oscillator according to one embodiment of the present invention.

As indicated in FIG. 9, according to embodiments of the present invention, the StandBy signal is distributed to the scaling and buffering circuit 42, the current generation circuit 44, [the integration circuit 46, and] the comparison circuit 50, *and the shaping and buffering circuit 52*. When ClockRequest=0 but StandBy=1, the clock generation circuit 14 enters a STANDBY mode, in which pre-bias currents are supplied to amplifiers in the clock generation circuit 14 to reduce startup transients, and hence startup time, when the clock generation circuit 14 is turned fully ON.

Figure 10:
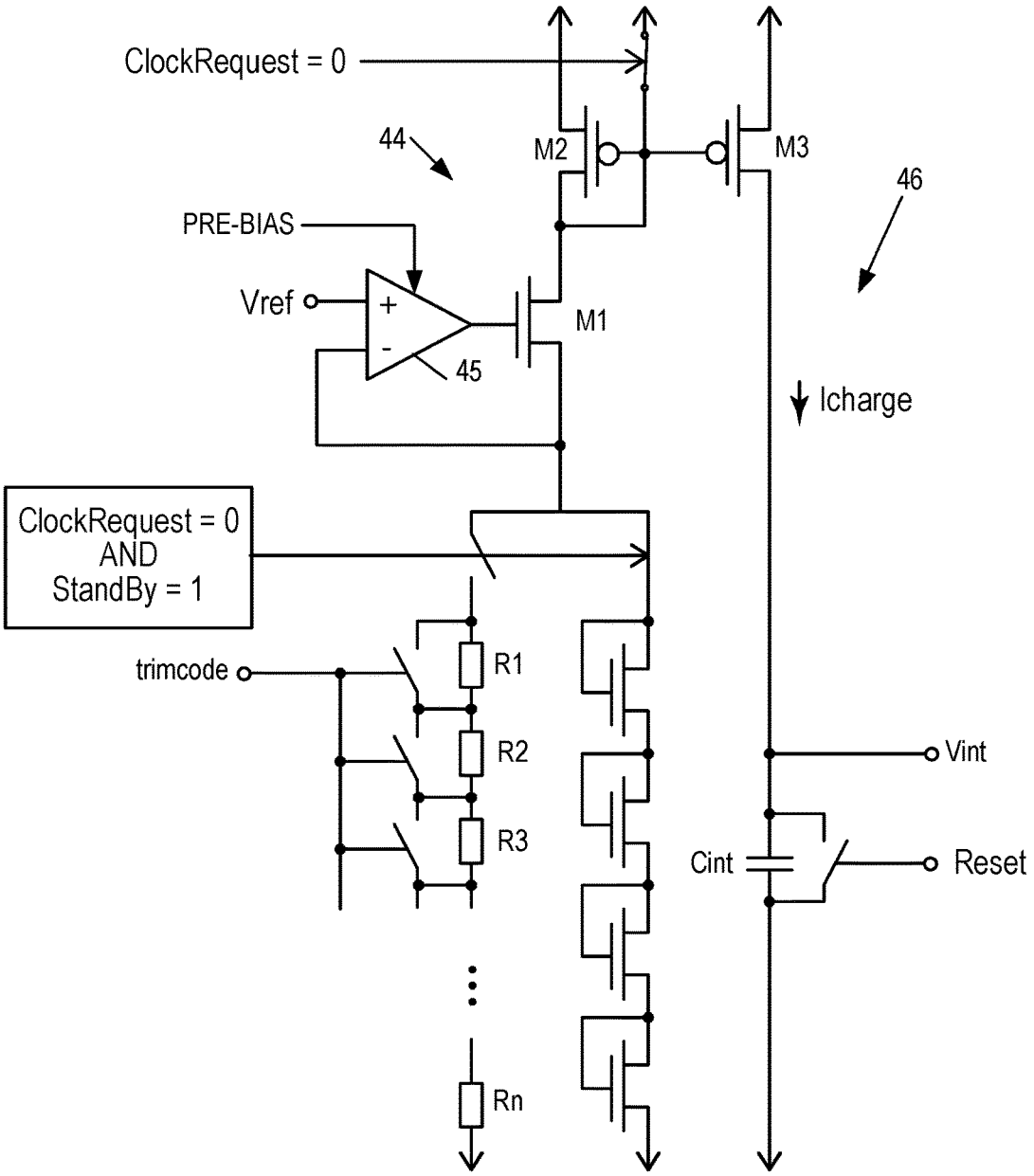
FIG. 10 is a functional schematic diagram of the current generation and integration circuits of the oscillator of FIG. 9.

FIG. 10 depicts the current generation circuit 44 and integration circuit 46 in STANDBY mode, according to one embodiment. As with the prior art circuit of FIG. 7, ClockRequest=0 pulls the gates of the mirror current transistors M2, M3 high, turning M3 off and making Icharge=0 in the integration circuit 46. The amplifier 45 receives a low pre-bias current. Logic in the current generation circuit 44 replaces the trim resistors with a series of diode-connected transistors when ClockRequest=0 AND StandBy=1. In this configuration, both the amplifier 45 and the transistor M1 are biased very close to their operating points. M1 can then return to full conduction very rapidly when ClockRequest=1, with low transients that quickly settle, yielding a very short startup time to a stable clock output.

Figure 11:
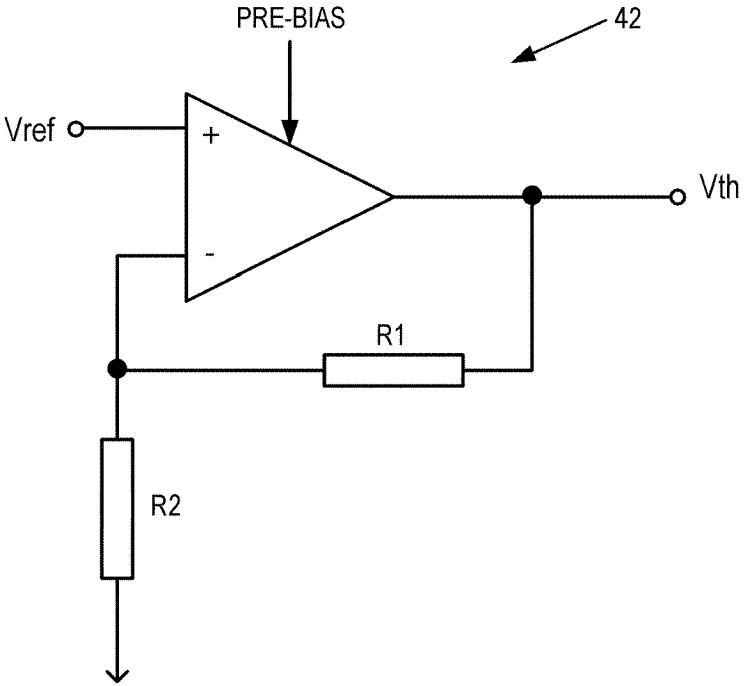
FIG. 11 is a functional schematic diagram of the scaling and buffering circuit of the oscillator of FIG. 9.

FIG. 11 depicts the StandBy input providing a pre-bias current to the comparator amplifier in the scaling and buffering circuit 42 during STANDBY mode. This biases the amplifier to near its operational point. The values of resistors R1 and R2 are increased so that the amplifier with lower biasing can drive them. Higher resistor values are not problematic since the threshold voltage Vth is always constant and there is no need to settle fast. The amplifier bias is increased when the clock generation circuit 14 is turned ON so that the threshold voltage Vth is more stable, even when the comparator is switching.

Figure 12:
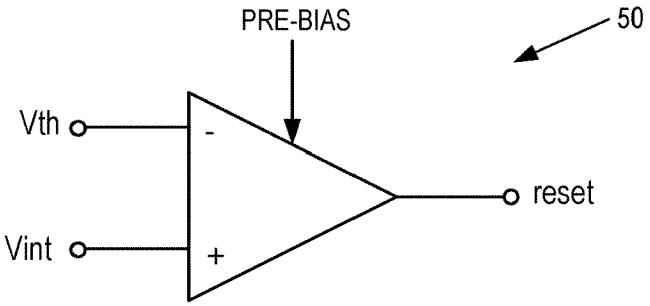
FIG. 12 is a functional schematic diagram of the comparison circuit of the oscillator of FIG. 9.

FIG. 12 depicts the StandBy input providing a pre-bias current to the comparator amplifier in the comparison circuit 50 during STANDBY mode. This biases the amplifier to near its operational point. The amplifier bias is increased when the clock generation circuit 14 is turned ON so that the comparator can switch rapidly enough.

FIGS. 13-16 depict transistor-level views of various embodiments of the current generation circuit 44 and integration circuit 46 of the relaxation oscillator of a clock generation circuit 14. For clarity, a single control signal "enable" and its inverse "disable" are shown controlling switches. The enable/disable signals result from the ClockRequest signal described above (and possibly other system logic).

Figure 13:
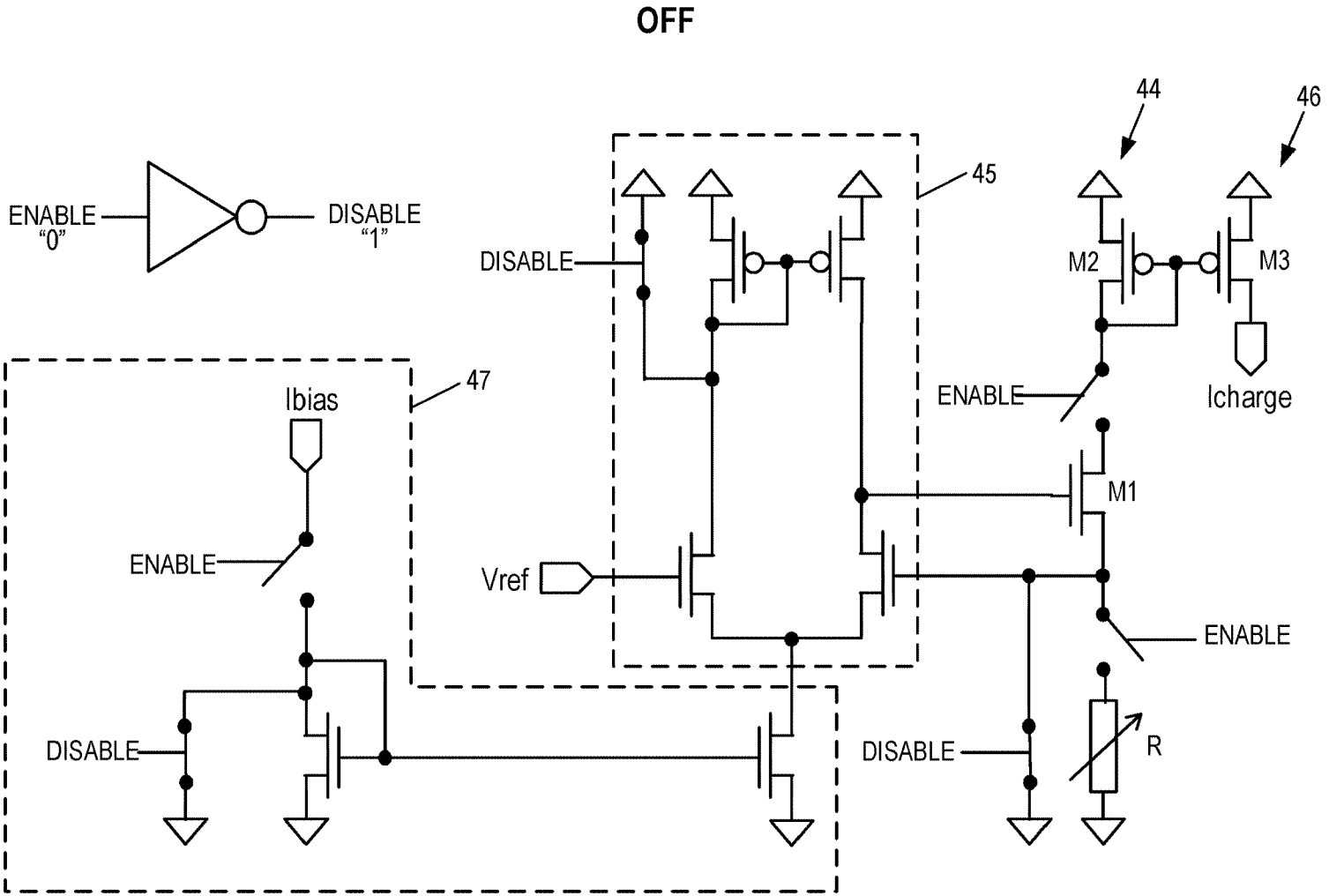
FIG. 13 is a functional transistor level schematic diagram of the current generation and integration circuits of a relaxation oscillator in the OFF state.
Figure 14:
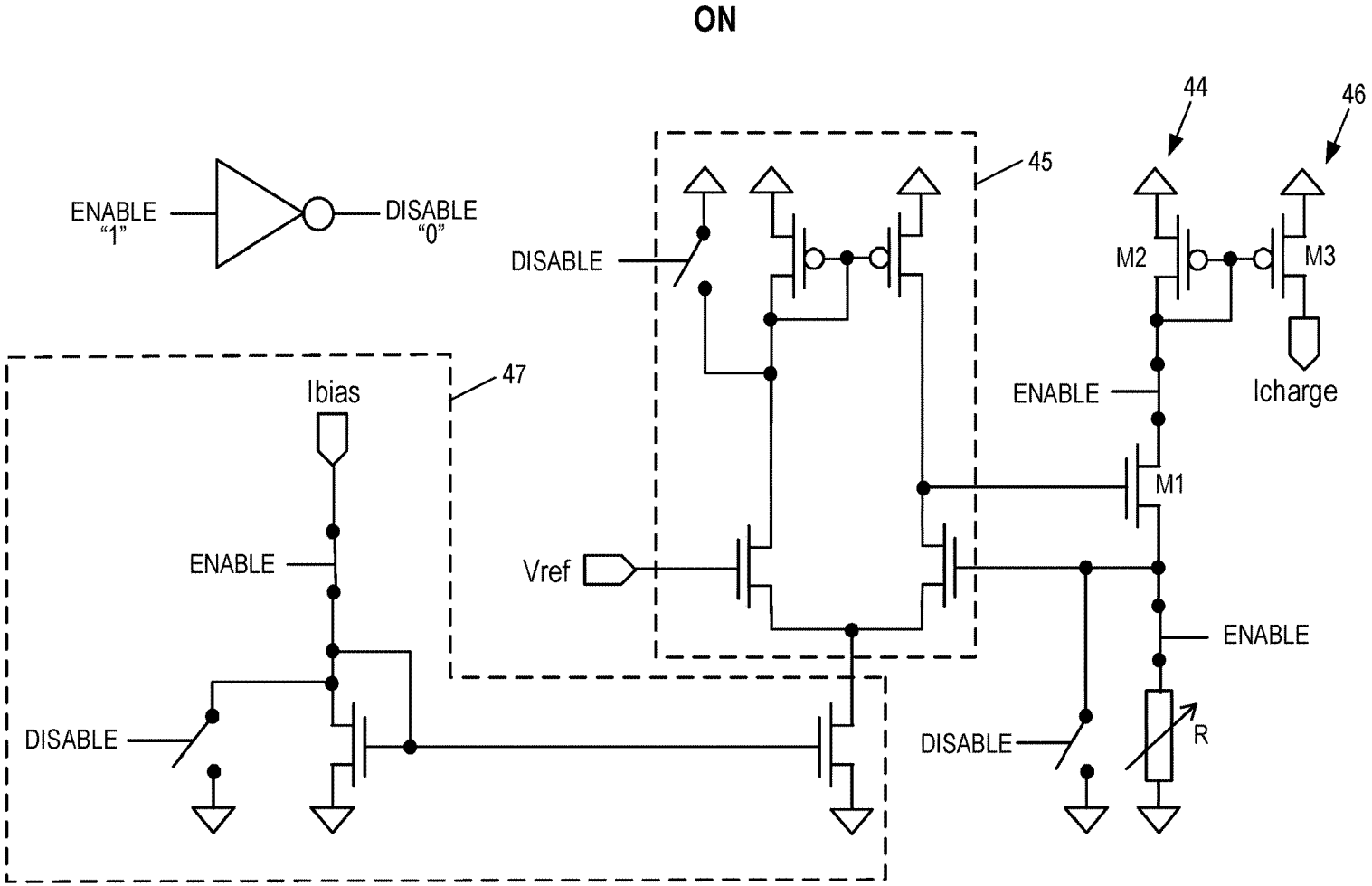
FIG. 14 is a functional transistor level schematic diagram of the current generation and integration circuits of FIG. 13 in the ON state.

FIG. 13 depicts a conventional circuit, in which the clock generation circuit 14 is OFF. FIG. 14 depicts the same circuit in the ON state. The current generation path 44 includes transistors M2, M1, and the variable (trim) resistors. An amplifier 45 drives the gate of M1. A bias current circuit 47 provides additional current Ibias to the amplifier 45, in the ON state.

FIG. 13 depicts the clock generation circuit 14 in the OFF state. The transistor M1 is isolated, with no current flowing through the variable resistance R to generate current in the current generating path 44. Thus, no charging current Icharge flows in the integration path 46 to charge a capacitor (not shown). The amplifier 45 is disabled, and its inverting input is grounded. The bias current circuit 47 is disabled.

FIG. 14 depicts the same circuits in the ON state. The transistor M1 is connected to both M2 and the resistors R, generating current in the path 44, which is mirrored in the integration path 46 as Icharge. The amplifier 45 is enabled, its inverting input is connected to the source of M1, and a bias current Ibias is applied to the amplifier 45 by the bias circuit 47. Because Ibias goes from zero to its full value when the oscillator 14 is switched ON, transients at the output of the amplifier 45 require several microseconds to stabilize.

Figure 15:
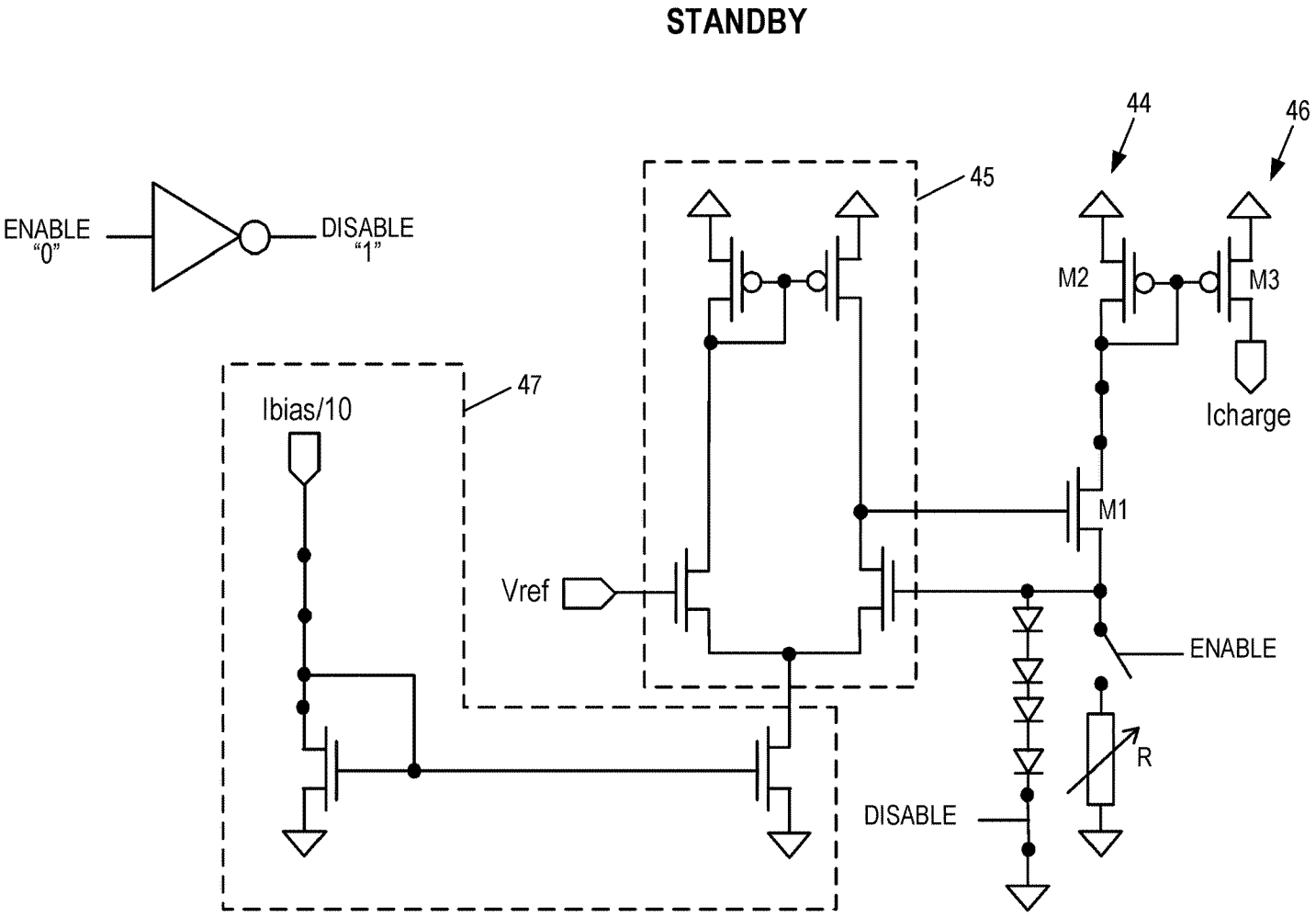
FIG. 15 is a functional transistor level schematic diagram of the current generation and integration circuits of a relaxation oscillator in a STANDBY state.
Figure 16:
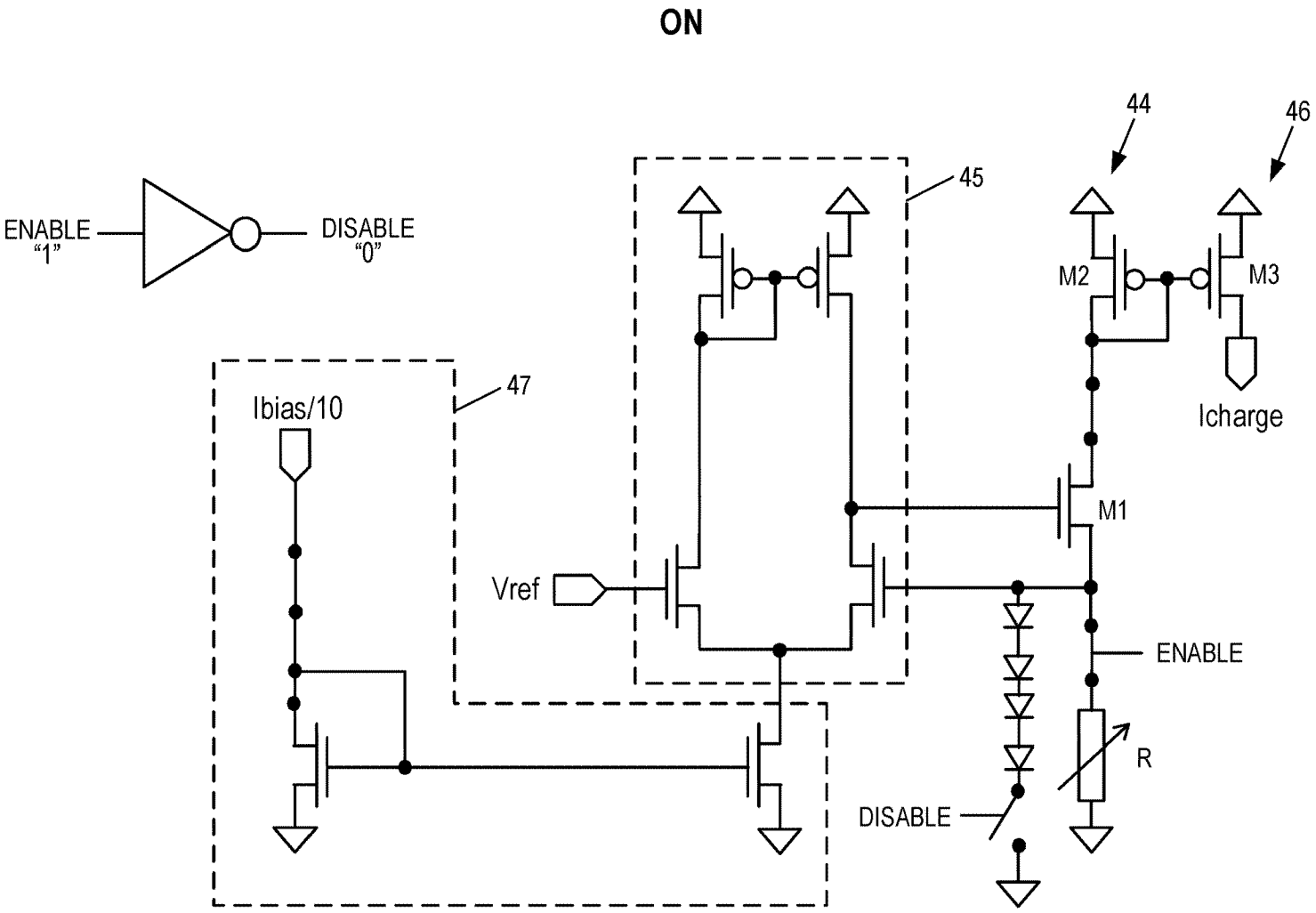
FIG. 16 is a functional transistor level schematic diagram of the current generation and integration circuits of FIG. 15 in the ON state.

FIGS. 15 and 16 depict similar circuits, but in which a small bias current Ibias/10 is continuously applied to the amplifier 45. That is, FIG. 15 depicts the clock generation circuit 14 in STANDBY mode, and FIG. 16 shows it in the fully ON state.

In FIG. 15, the amplifier 45 is enabled, and its inverting input is connected to the current generation path 44, in which a small current flows through M1 and the chain of diodes. A small bias current Ibias/10 is continuously applied to the amplifier 45 by the bias circuit 47. This keeps the amplifier 45 biased very close to its operating point.

In FIG. 16, the clock generation circuit 14 is switched ON, and the trim resistors R are switched into the current generating path 44. Charging current Icharge is established in the integration path 46. The amplifier 45 is fully enabled, and Ibias/10 is continuously applied by the bias circuit 47.

Figure 17B:
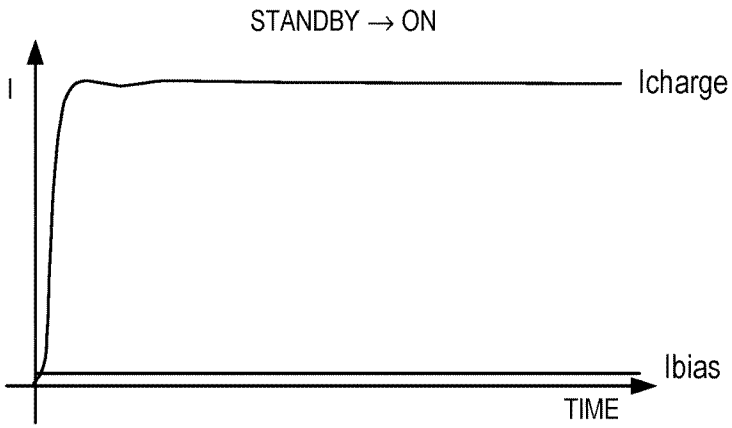
FIG. 17B is a graph of reference current transients and bias current in the circuit of FIGS. 15 and 16.
Figure 17A:
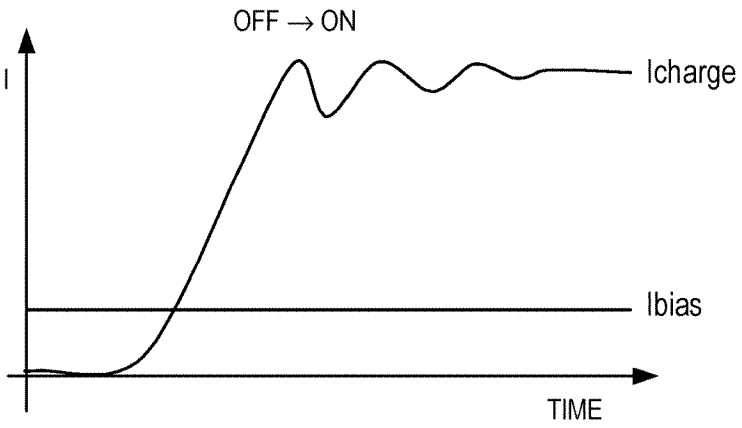
FIG. 17A is a graph of reference current transients and bias current in the circuit of FIGS. 13 and 14.

FIG. 17A is a graph of transients on Icharge and the bias current Ibias as the clock generation circuit 14 switches from OFF to ON. FIG. 17B depicts the same for transitioning the clock generation circuit 14 between STANDBY and ON modes. With constant bias (i.e., the STANDBY mode), the bias points of the amplifier 45 are almost constant all the time, and therefore the transients are much smaller. They also settle faster, allowing for a faster startup time. Additionally, the bias current can be much lower (e.g., in the range of 10% of the full bias current).

Figure 18:
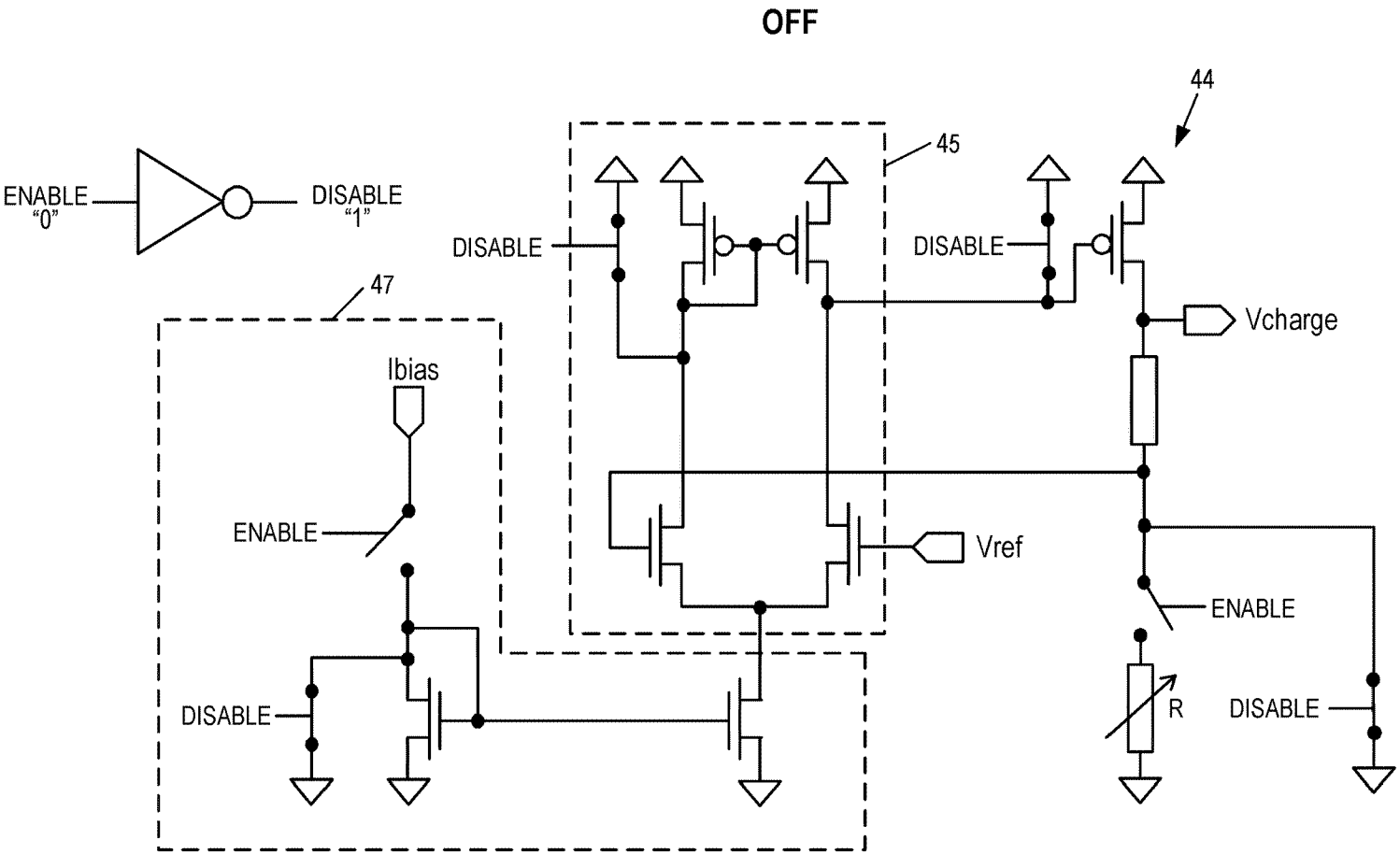
FIG. 18 is a functional transistor level schematic diagram of the charging voltage generation circuit of a relaxation oscillator in the OFF state.
Figure 19:
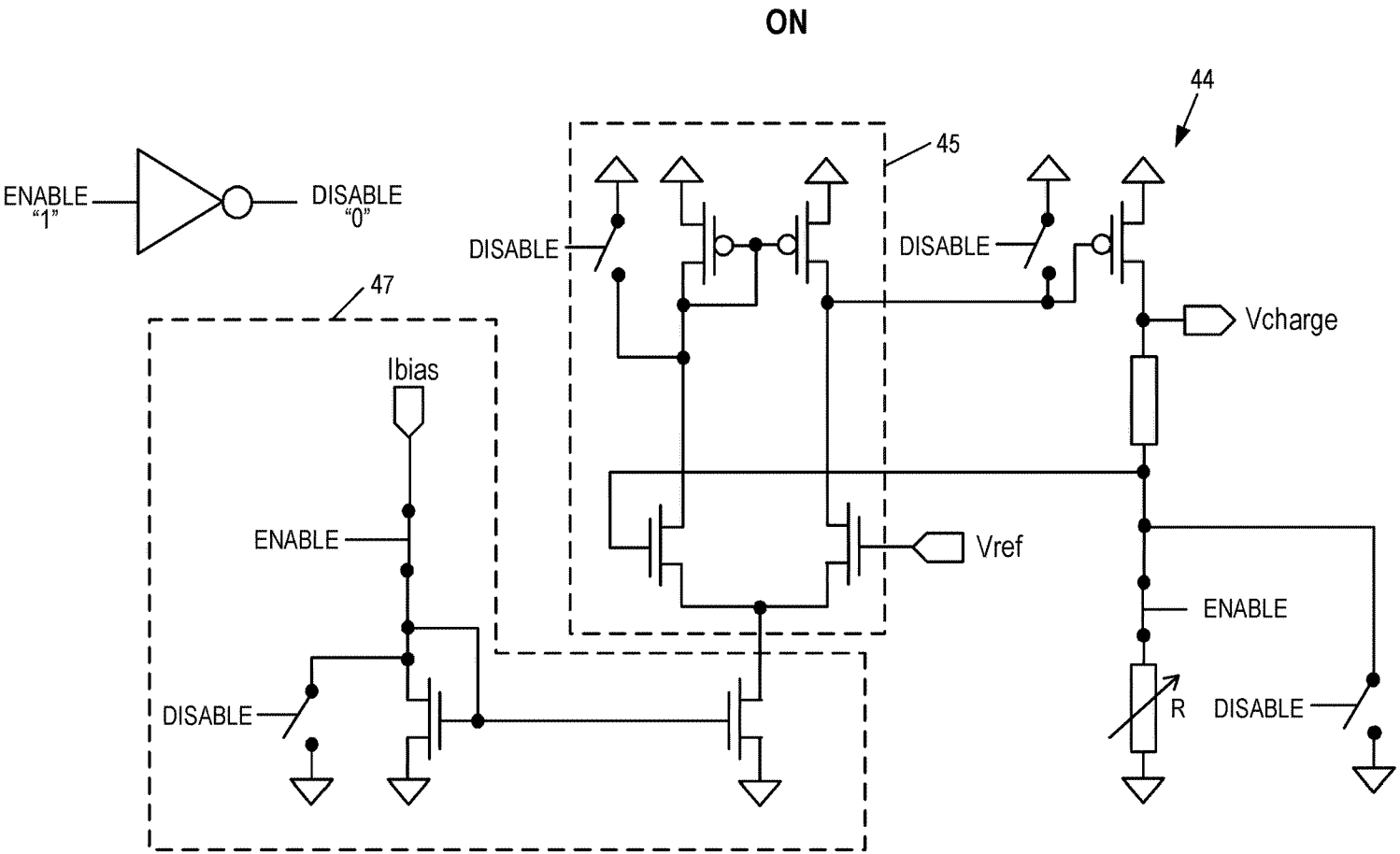
FIG. 19 is a functional transistor level schematic diagram of the charging voltage generation circuit of FIG. 18 in the ON state.
Figure 20:
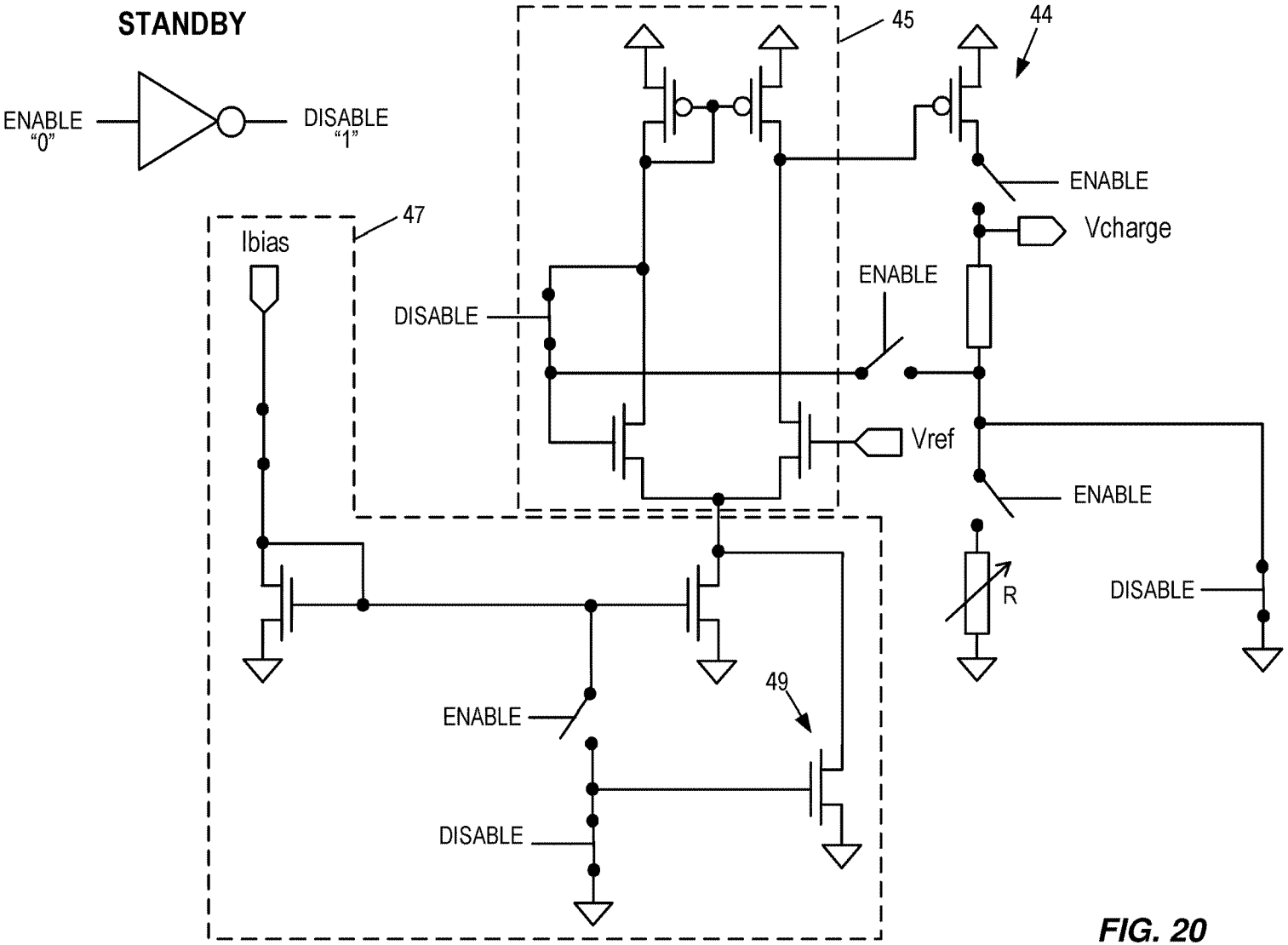
FIG. 20 is a functional transistor level schematic diagram of another charging voltage generation circuit of a relaxation oscillator in the STANDBY state.
Figure 21:
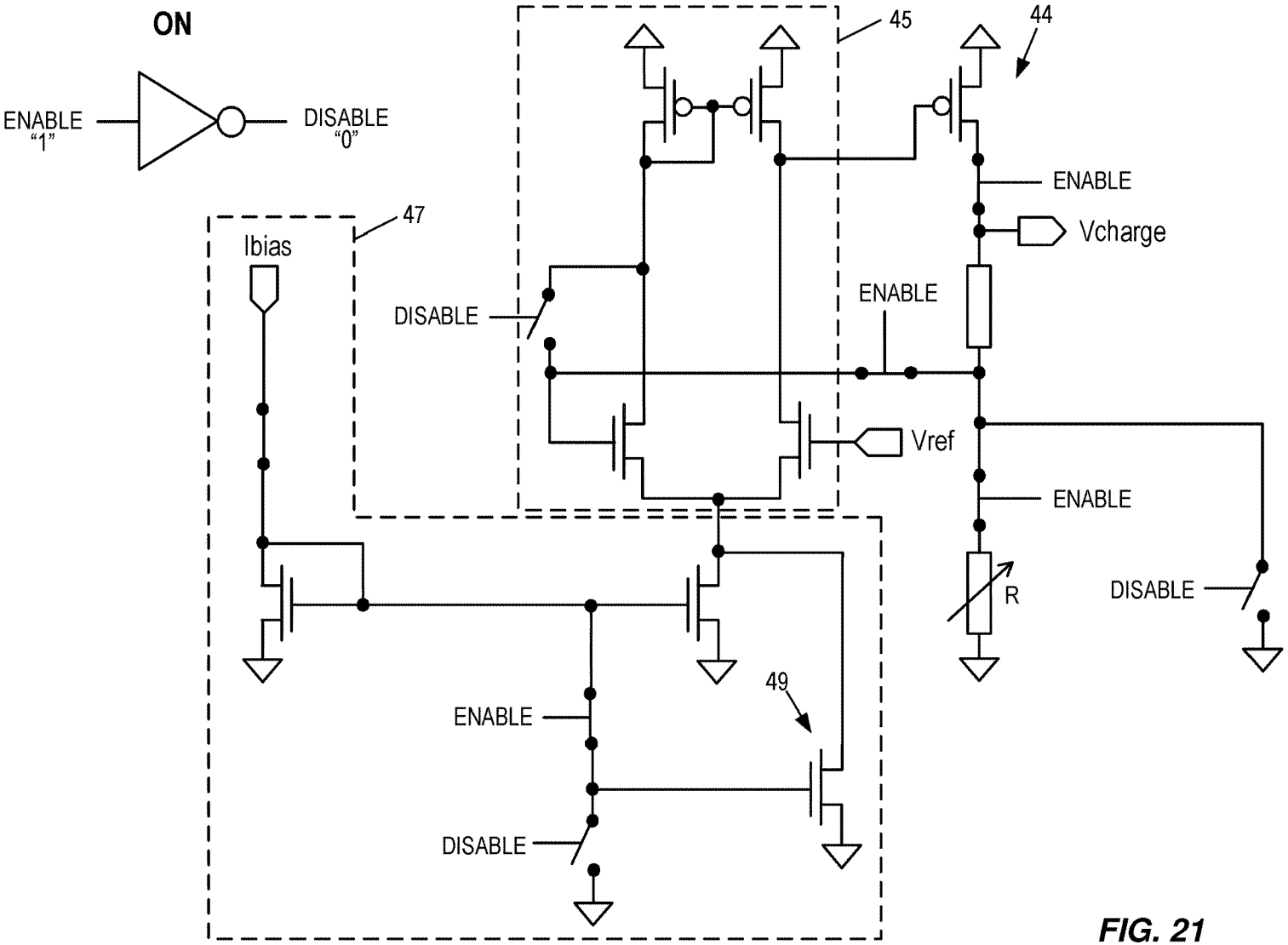
FIG. 21 is a functional transistor level schematic diagram of the charging voltage generation circuit of FIG. 20 in the OFF state.
Figure 22:
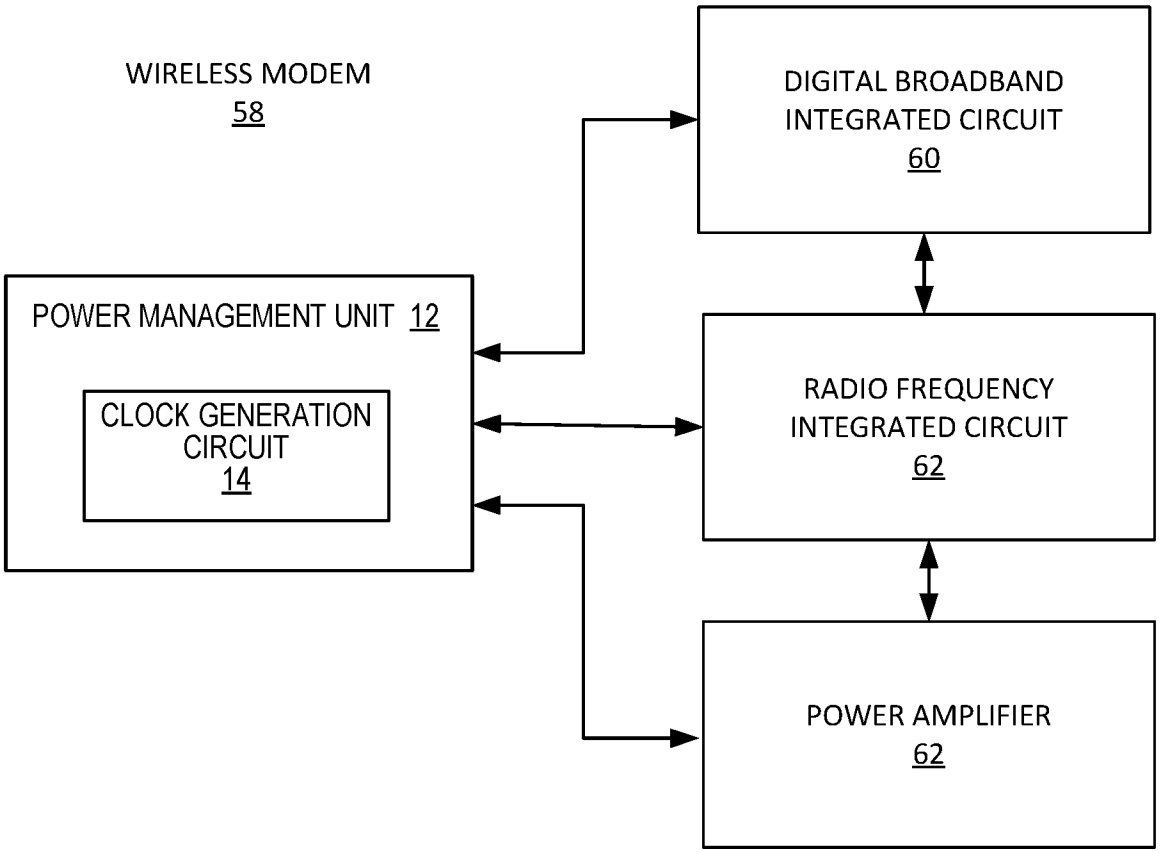
*FIG. 22 is a block diagram of a wireless modem.*

FIGS. 18-21 depict transistor-level views of other embodiments of the current generation circuit 44 and integration circuit 46 of a relaxation oscillator in a clock generation circuit 14, wherein the integration circuit generates a integration capacitor charging voltage Vcharge rather than the reference current Icharge described above. FIGS. 18 and 19 depict the case of switched biasing, where the clock generation circuit 14 is in OFF and ON states, respectively. FIGS. 20 and 21 depict the same circuit with constant biasing, where the clock generation circuit 14 is in STANDBY and ON states, respectively.

In FIG. 18, the current generating path 44 and amplifier 45 are disabled, and no current flows through the variable (trim) resistors. The bias current circuit 47 is also disabled. Vcharge=0, so the integration capacitor (not shown) does not charge/discharge to generate a Clock signal.

In FIG. 19, the current generating path 44 and amplifier 45 are enabled, and current through the variable (trim) resistors generates a charging voltage Vcharge. The bias circuit 47 is enabled, providing a bias current Ibias to the amplifier 45.

FIG. 20 depicts an embodiment where a partial bias is applied to the amplifier 45, when the clock generation circuit 14 is in STANDBY mode. No current flows through the variable (trim) resistors, so Vcharge=0. However, the amplifier 45 is enabled and the bias circuit 47 applies a partial bias current. Note that transistor 49 is disabled, limiting the bias current to only that required to bias the amplifier 45 to near its operating point.

FIG. 21 depicts the clock generation circuit 14 in fully ON state. Current flowing through the variable (trim) resistors generates a charging voltage Vcharge. The amplifier 45 is fully on, and the bias current circuit 47 provides both the standby bias current, and additionally enables transistor 49, providing additional bias current. This additional bias current during operation helps the amplifier 45 deal with transient loads.

In all of the embodiments described above, a clock generation circuit 14 transitions from a STANDBY mode, in which a small, pre-bias current is applied to amplifiers, to a fully ON state, with fewer transients, which quickly settle to a steady-state. Hence, the clock generation circuit 14 startup time is dramatically shorter than in prior art designs, which only transition the clock generation circuit 14 between OFF and ON states. The pre-bias current consumption in the STANDBY state is small, such as in the range of 10% of the bias current applied in the ON state. The very fast startup time allows the clock generation circuit 14 to be placed in STANDBY more often than conventional circuits, thus reducing overall power consumption, despite the small pri-bias current consumption in the STANDBY state. For example, the clock generation circuit 14 may be placed in STANDBY mode when an external bus or wireless interface is dormant, but may become active at any time, requiring e.g., the capture of burst data transfers.

The STANDBY bias current circuits disclosed herein are straightforward. As such, they are robust on silicon variation, and portable between silicon technologies. Additionally, by providing a very short startup time from STANDBY to ON, designers may optimize the ON mode power consumption and performance, without concern for startup performance.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of operating a clock generation circuit on an integrated circuit, the clock generation circuit including an oscillator circuit, comprising:

monitoring clock request indicators from one or more circuits;

if at least one circuit requests [a] *an associated* clock signal, operating the clock generation circuit in a first, full power mode in which the clock generation circuit outputs at least one clock signal;

if no circuit requests [a] *an associated* clock signal, determining whether a second, sleep mode is allowed, in which the oscillator circuit is disabled and the clock generation circuit outputs no clock signal;

if the second, sleep mode is allowed, operating the clock generation circuit in the second, sleep mode;

if the second, sleep mode is not allowed, operating the clock generation circuit in a third, standby mode in which one or more circuit nodes in the clock generation circuit are biased near their operating voltages but the oscillator circuit does not oscillate and the clock generation circuit outputs no clock signal.

2. The method of claim 1 further comprising, when the clock generation circuit is in the third, standby mode:

detecting at least one clock request indication;

in response to detecting at least one clock request indication, transitioning the clock generation circuit from the third, standby mode to the first, full power mode;

wherein a start-up time from detecting at least one clock request indication to outputting a stable clock signal is less than 10 usec.

3. The method of claim 2 wherein the start-up time is less than 2 usec.

4. The method of claim 1 wherein power consumption of the clock generation circuit in the third, standby mode is at least 50% less than in the first, full power mode.

5. The method of claim 4 wherein power consumption of the clock generation circuit in the third, standby mode is at least 90% less than in the first, full power mode.

6. The method of claim 1 wherein the clock generation circuit has separate first and second enable inputs, and wherein operating the clock generation circuit in the first, full power mode comprises asserting both first and second enable signals applied to the first and second enable inputs, respectively;

operating the clock generation circuit in the second, sleep mode comprises deasserting both *of the* first and second enable signals; and operating the clock generation circuit in the third, standby mode comprises asserting the first enable signal and deasserting the second enable signal.

7. The method of claim 1 wherein operating the clock generation circuit in the first, full power mode comprises providing a first bias current to the clock generation circuit;

operating the clock generation circuit in the second, sleep mode comprises providing no bias current to the clock generation circuit; and operating the clock generation circuit in the third, standby mode comprises providing a second bias current, less than the first bias current, to the clock generation circuit.

8. The method of claim 7 wherein the second bias current is about 10% of the first bias current or less.

9. The method of claim 1 wherein the oscillator circuit is an RC oscillator.

10. The method of claim 1 wherein the oscillator circuit is a relaxation oscillator.

11. A clock generation circuit, comprising:

an oscillator circuit operative to selectively generate a periodic signal;

an output circuit receiving [a] *the* periodic signal from the oscillator circuit and operative to selectively output at least one clock signal;

a bias circuit operative to control the clock generation circuit to operate in one of three modes, selected from the group consisting of a first, full power mode in which the output circuit outputs *the* at least one clock signal;

a second, sleep mode in which the oscillator circuit is disabled and the output circuit outputs no clock signal; and a third, standby mode in which nodes within the oscillator circuit [and output circuit] are biased near their operating voltages but the oscillator circuit does not oscillate and the output circuit outputs no clock signal.

[12. The clock generation circuit of claim 11 further comprising at least one control input, and wherein, in response to one or more signals received at the at least one control input, the clock generation circuit is operative to transition from the third, standby mode to the first, full power mode, and wherein a start-up time from the one or more control signals to outputting a stable clock signal is less than 10 usec.]

[13. The clock generation circuit of claim 12 wherein the start-up time is less than 2 usec.]

[14. The clock generation circuit of claim 11 wherein power consumption of the clock generation circuit in the third, standby mode is at least 50% less than in the first, full power mode.]

[15. The clock generation circuit of claim 14 wherein power consumption of the clock generation circuit in the third, standby mode is at least 90% less than in the first, full power mode.]

[16. The clock generation circuit of claim 12 wherein the at least one control input comprises separate first and second enable inputs, and wherein the bias circuit is operative to operate the clock generation circuit in the first, full power mode in response to both first and second enable signals received at the first and second enable inputs, respectively, being asserted;

operate the clock generation circuit in the second, sleep mode in response to both first and second enable signals being deasserted; and operating the clock generation circuit in the third, standby mode in response to the first enable signal being asserted and the second enable signal being deasserted.]

[17. The clock generation circuit of claim 11 wherein the bias circuit is operative to operate the clock generation circuit in the first, full power mode by providing a first bias current to the clock generation circuit;

operate the clock generation circuit in the second, sleep mode by providing no bias current to the clock generator circuit; and operate the clock generation circuit in the third, standby mode by providing a second bias current, less than the first bias current, to the clock generation circuit.]

[18. The clock generation circuit of claim 17 wherein the second bias current is about 10% of the first bias current or less.]

[19. The clock generation circuit of claim 11 wherein the oscillator circuit is an RC oscillator.]

[20. The clock generation circuit of claim 11 wherein the oscillator circuit is a relaxation oscillator.]

*21. A clock generation circuit comprising:*

*an oscillator circuit including an amplifier and operative to selectively generate a periodic signal;*

*a bias circuit connected to the amplifier; and*

*an output circuit receiving the periodic signal from the oscillator circuit and operative to output a clock signal;*

*wherein the clock generation circuit is adapted to operate in one of a first full power mode, a second sleep mode or a third standby mode, dependent on an indication provided for the clock generation circuit; wherein*

*in the first full power mode, the oscillator circuit provides the periodic signal to the output circuit and the output circuit generates the clock signal;*

*in the second sleep mode, the oscillator circuit is disabled; and*

*in the third standby mode, the amplifier is biased to a voltage close to its amplifier operating voltage but the oscillator circuit does not generate the periodic signal.*

*22. The clock generation circuit of claim 21 wherein the oscillator circuit is an RC oscillator circuit and the amplifier is included in the RC oscillator circuit.*

*23. The clock generation circuit of claim 22 where the oscillator circuit is a relaxation oscillator circuit comprising a current generation circuit connected to an integration circuit and the amplifier is included in the current generation circuit.*

*24. The clock generation circuit of claim 23 wherein, in the third standby mode, a first transistor in the current generation circuit is biased to a voltage close to its transistor operating voltage.*

*25. The clock generation circuit of claim 23 wherein, in the first full power mode the first transistor is connected between a second transistor and a variable resistance unit and in the third standby mode the first transistor is connected between the second transistor and a plurality of diodes and wherein, in both the first full power mode and the third standby mode, the bias circuit provides a low bias current to the amplifier circuit.*

*26. The clock generation circuit of claim 25 wherein the gate of the second transistor in the current generation circuit is connected in a current mirror arrangement to the gate of*

*a third transistor in the integration circuit of the relaxation oscillator circuit and wherein in the first full power mode, a mirrored current is provided to a capacitor of the relaxation oscillator circuit.*

*27. The clock generation circuit of claim 21 wherein the indication comprises a clock request and a standby signal.*

*28. The clock generation circuit of claim 21 further comprising at least one control input to receive a clock request and a standby signal from a control unit.*

*29. A power management unit comprising a clock generation circuit including:*

*an oscillator circuit including an amplifier and operative to selectively generate a periodic signal;*

*a bias circuit connected to the amplifier; and*

*an output circuit receiving the periodic signal from the oscillator circuit and operative to output a clock signal;*

*wherein the clock generation circuit is adapted to operate in one of a first full power mode, a second sleep mode or a third standby mode, dependent on an indication provided for the clock generation circuit; wherein*

*in the first full power mode, the oscillator circuit provides the periodic signal to the output circuit and the output circuit generates the clock signal;*

*in the second sleep mode, the oscillator circuit is disabled; and*

*in the third standby mode, the amplifier is biased to an amplifier voltage close to its operating voltage but the oscillator circuit does not generate the periodic signal; and*

*a switch mode power supply circuit;*

*wherein, in the first full power mode, the switch mode power supply circuit receives the clock signal from the output circuit and provides power to an electronic circuit.*

*30. The power management unit of claim 29 wherein the oscillator circuit is an RC oscillator circuit and the amplifier is included in the RC oscillator circuit.*

*31. The power management unit of claim 29 where the oscillator circuit is a relaxation oscillator circuit comprising a current generation circuit connected to an integration circuit and the amplifier is included in the current generation circuit.*

*32. A wireless modem comprising a clock generation circuit including:*

*an oscillator circuit including an amplifier and operative to selectively generate a periodic signal;*

*a bias circuit connected to the amplifier; and*

*an output circuit receiving the periodic signal from the oscillator circuit and operative to output a clock signal;*

*wherein the clock generation circuit is adapted to operate in one of a first full power mode, a second sleep mode or a third standby mode, dependent on an indication provided for the clock generation circuit; wherein*

*in the first full power mode, the oscillator circuit provides the periodic signal to the output circuit and the output circuit generates the clock signal;*

*in the second sleep mode, the oscillator circuit is disabled; and*

*in the third standby mode, the amplifier is biased to an amplifier voltage close to its operating voltage but the oscillator circuit does not generate the periodic signal.*

*33. The wireless modem of claim 32 wherein the oscillator circuit is an RC oscillator circuit and the amplifier is included in the RC oscillator circuit.*

*34. The wireless modem of claim 32 where the oscillator circuit is a relaxation oscillator circuit comprising a current generation circuit connected to an integration circuit and the amplifier is included in the current generation circuit.*

*35. The wireless modem of claim 32 further comprising at least one of a digital broadband integrated circuit, a radio frequency integrated circuit, and a power amplifier.*

*36. A wireless communication terminal comprising a clock generation circuit including:*

*an oscillator circuit including an amplifier and operative to selectively generate a periodic signal;*

*a bias circuit connected to the amplifier; and*

*an output circuit receiving the periodic signal from the oscillator circuit and operative to output a clock signal;*

*wherein the clock generation circuit is adapted to operate in one of a first full power mode, a second sleep mode or a third standby mode, dependent on an indication provided for the clock generation circuit; wherein*

*in the first full power mode, the oscillator circuit provides the periodic signal to the output circuit and the output circuit generates the clock signal;*

*in the second sleep mode, the oscillator circuit is disabled; and*

*in the third standby mode, the amplifier is biased to an amplifier voltage close to its operating voltage but the oscillator circuit does not generate the periodic signal.*

*37. The wireless communication terminal of claim 36 wherein the oscillator circuit is an RC oscillator circuit and the amplifier is included in the RC oscillator circuit.*

*38. The wireless communication terminal of claim 36 where the oscillator circuit is a relaxation oscillator circuit comprising a current generation circuit connected to an integration circuit and the amplifier is included in the current generation circuit.*

* * * * *